(12) United States Patent
Ju et al.

(10) Patent No.: US 11,038,151 B2
(45) Date of Patent: Jun. 15, 2021

(54) DISPLAY DEVICE

(71) Applicant: Samsung Display Co., Ltd., Yongin-Si (KR)

(72) Inventors: Jin Ho Ju, Seoul (KR); Dong Ki Lee, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/689,744

(22) Filed: Nov. 20, 2019

(65) Prior Publication Data

US 2020/0243802 A1    Jul. 30, 2020

(30) Foreign Application Priority Data

Jan. 24, 2019    (KR) ........................ 10-2019-0009491

(51) Int. Cl.
| | | |
|---|---|---|
| H01L 51/52 | (2006.01) | |
| H01L 27/32 | (2006.01) | |
| H01L 51/00 | (2006.01) | |
| G06F 3/044 | (2006.01) | |
| G06F 3/041 | (2006.01) | |

(52) U.S. Cl.
CPC ........ *H01L 51/5281* (2013.01); *G06F 3/0412* (2013.01); *G06F 3/0446* (2019.05); *H01L 27/322* (2013.01); *H01L 27/323* (2013.01); *H01L 27/3272* (2013.01); *H01L 51/0097* (2013.01); *G06F 2203/04102* (2013.01); *G06F 2203/04112* (2013.01); *H01L 2251/5338* (2013.01)

(58) Field of Classification Search
CPC . G06F 2203/04102; G06F 2203/04112; G06F 3/0412; G06F 3/0446; H01L 2251/5338; H01L 27/322; H01L 27/323; H01L 27/3272; H01L 51/0097; H01L 51/5281
See application file for complete search history.

(56) References Cited

U.S. PATENT DOCUMENTS

| | | | | |
|---|---|---|---|---|
| 2004/0253413 A1* | 12/2004 | Baba | ...................... | H01L 27/322 428/141 |
| 2007/0090350 A1* | 4/2007 | Lee | ........................ | H01L 27/322 257/40 |
| 2010/0052521 A1 | 3/2010 | Kim et al. | | |
| 2012/0104372 A1* | 5/2012 | Kim | .................... | H01L 51/5275 257/40 |

(Continued)

FOREIGN PATENT DOCUMENTS

| | | |
|---|---|---|
| KR | 2013-0048611 | 5/2013 |
| KR | 2016-0068105 | 6/2016 |
| KR | 2018-0028388 | 3/2018 |

*Primary Examiner* — Hong Zhou
(74) *Attorney, Agent, or Firm* — H.C. Park & Associates, PLC

(57) ABSTRACT

A display device including a display unit having a first region, which is flat, and second regions, which are curved, and a touch sensor layer disposed on the display unit. The touch sensor layer includes a high refractive index layer having a first refractive index and a planarization layer disposed on the high refractive index layer and having a second refractive index, which is smaller than the first refractive index, and the high refractive index layer includes pattern parts.

16 Claims, 22 Drawing Sheets

(56) References Cited

U.S. PATENT DOCUMENTS

| | | | |
|---|---|---|---|
| 2014/0027725 A1* | 1/2014 | Lim | H01L 51/5275 257/40 |
| 2014/0175399 A1* | 6/2014 | Choi | H01L 51/56 257/40 |
| 2014/0353626 A1* | 12/2014 | Shim | G02B 5/201 257/40 |
| 2015/0069373 A1 | 3/2015 | Lee | |
| 2015/0169110 A1* | 6/2015 | Nah | G06F 3/0446 345/174 |
| 2015/0333108 A1* | 11/2015 | Miyamoto | H01L 51/5275 257/89 |
| 2016/0011689 A1* | 1/2016 | Kim | G06F 3/045 345/173 |
| 2017/0092703 A1* | 3/2017 | Bae | G02F 1/13439 |
| 2017/0192140 A1* | 7/2017 | Yoon | G06F 1/1626 |
| 2017/0357348 A1* | 12/2017 | Lee | G02B 1/14 |
| 2018/0136754 A1* | 5/2018 | Kim | G02F 1/13338 |
| 2018/0160552 A1* | 6/2018 | Choi | H01L 51/5268 |
| 2019/0114012 A1* | 4/2019 | Ma | G06F 3/0412 |
| 2019/0155428 A1* | 5/2019 | Lee | G06F 3/044 |

* cited by examiner

DISPLAY DEVICE

CROSS REFERENCE TO RELATED APPLICATION

This application claims priority from and the benefit of Korean Patent Application No. 10-2019-0009491, filed on Jan. 24, 2019, which is hereby incorporated by reference for all purposes as if fully set forth herein.

BACKGROUND

Field

Exemplary embodiments of the invention relate generally to a display device.

Discussion of the Background

As the information society develops, the demand for display devices for displaying images has increased and diversified. Accordingly, a variety of display devices, such as a liquid crystal display (LCD) device, a plasma display panel (PDP) device, an organic light-emitting diode (OLED) display device, and the like have been developed and used.

The OLED display device, which is a self-emitting display device, has a wider viewing angle and higher contrast ratio than the LCD device; does not require a separate backlight module and can thus be fabricated as a thin, lightweight display device; and has excellent power consumption characteristics. Also, the OLED display device can be driven with a low direct current (DC) voltage, has fast response speed, and can be manufactured at low cost.

The OLED display device includes OLEDs for emitting light and a bank layer defining the OLEDs. Each of the OLEDs include an anode electrode, a hole transport layer, an organic light-emitting layer, an electron transport layer, and a cathode electrode. In response to a high-potential voltage and a low-potential voltage being applied to the anode electrode and the cathode electrode, respectively, holes and electrons may move to the organic light-emitting layer through the hole transport layer and the electron transport layer, respectively, and may be combined together in the organic light-emitting layer to emit light.

However, the display quality of the OLED display device may be degraded if external light is reflected and then becomes visible to the eyes of a user.

The above information disclosed in this Background section is only for understanding of the background of the inventive concepts, and, therefore, it may contain information that does not constitute prior art.

SUMMARY

Exemplary embodiments of the present invention provide a display device capable of not only reducing reflected light that is visible to the eyes of a user, but also improving emission efficiency.

Additional features of the inventive concepts will be set forth in the description which follows, and in part will be apparent from the description, or may be learned by practice of the inventive concepts.

An exemplary embodiment of the present invention provides a display device including a first region, which is flat, and second regions, which are curved; and a touch sensor layer disposed on the display unit. The touch sensor layer includes a high refractive index layer having a first refractive index and a planarization layer disposed on the high refractive index layer and having a second refractive index, which is smaller than the first refractive index, and the high refractive index layer includes pattern parts.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
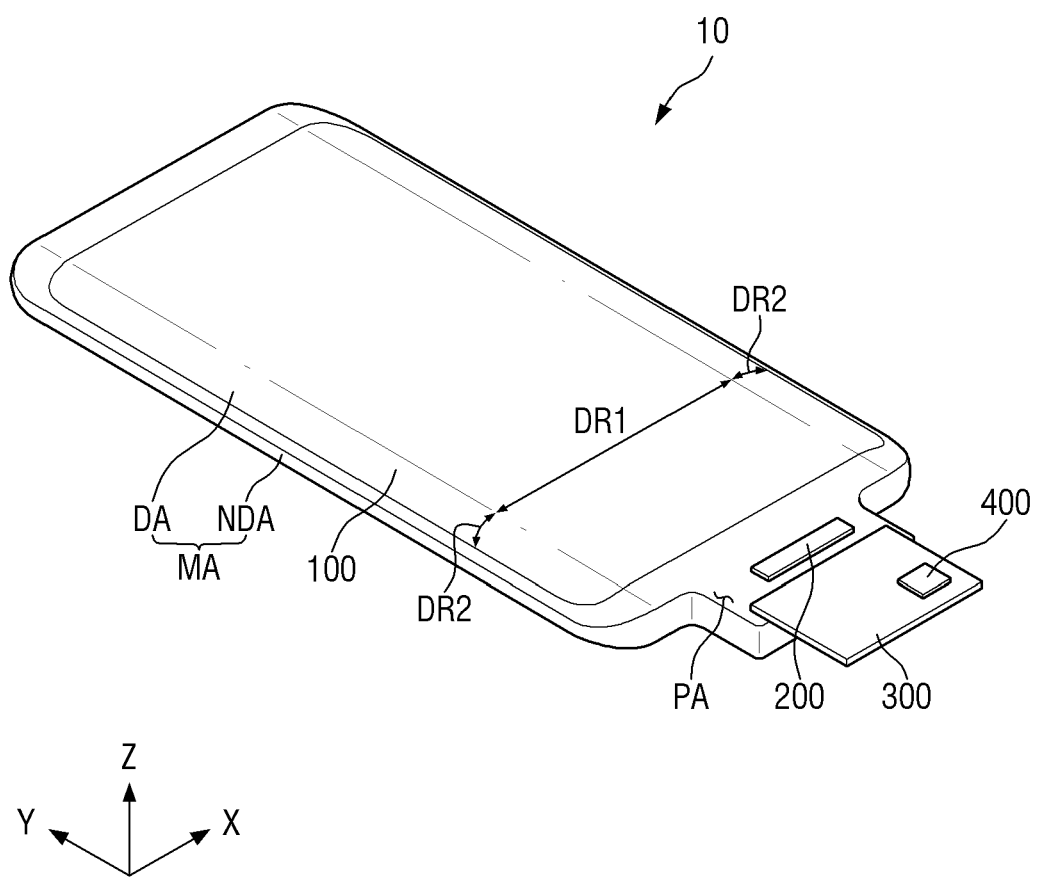
FIG. 1 is a perspective view of a display device according to an embodiment of the present invention.

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalties between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
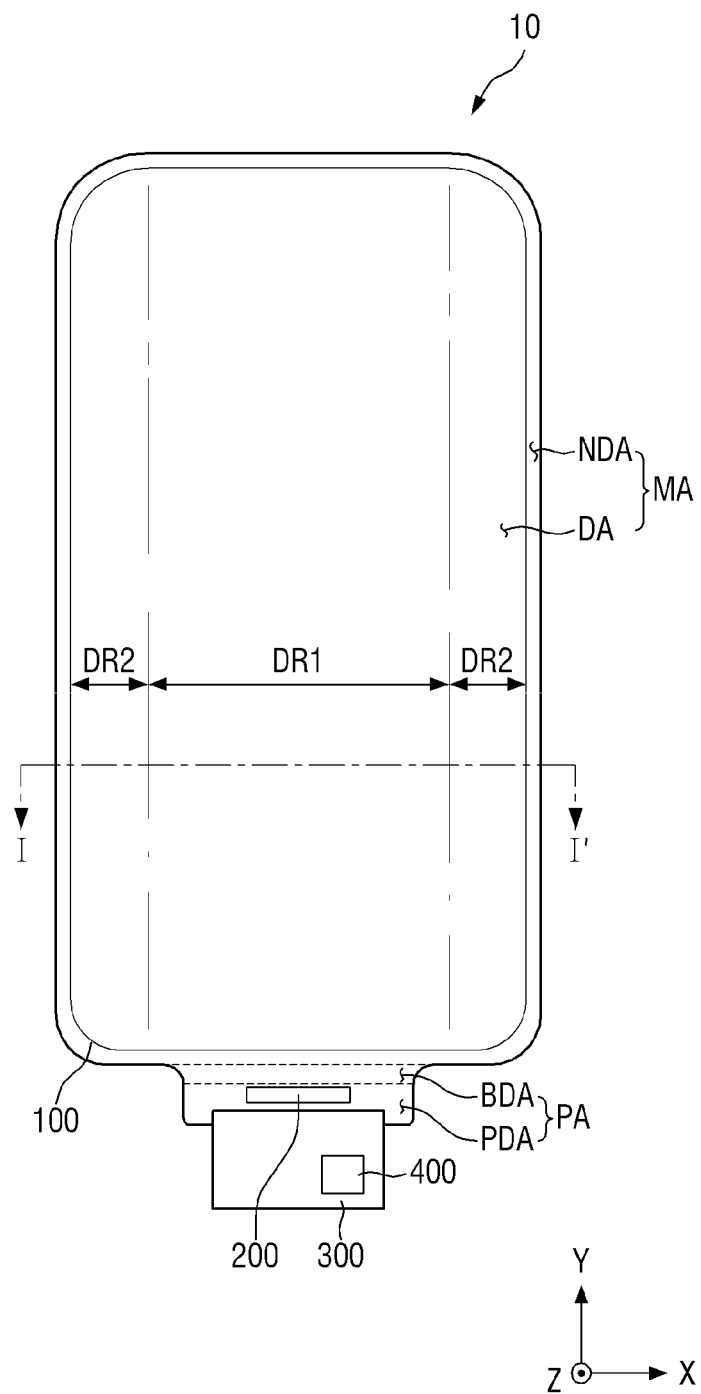
FIG. 2 is a plan view of the display device of FIG. 1.

FIG. 1 is a perspective view of a display device according to an exemplary embodiment of the present invention. FIG. 2 is a plan view of the display device of FIG. 1.

The terms "above", "top", and "top surface", as used herein, denote an upward direction with respect to a display panel 100, i.e., a Z-axis direction, and the terms "below", "bottom", and "bottom surface", as used herein, denote a downward direction with respect to the display panel 100, i.e., the direction opposite to the Z-axis direction. Also, the terms "left", "right", "upper", and "lower", as used herein, denote directions as viewed from above the display panel 100. For example, the term "left" denotes the direction opposite to an X-axis direction, the term "right" denotes the X-axis direction, the term "upper" denotes a Y-axis direction, and the term "lower" denotes the direction opposite to the Y-axis direction.

Referring to FIGS. 1 and 2, a display device 10, which displays moving or still images, may be used as a display screen not only for a mobile electronic device (e.g., a mobile phone, a smartphone, a tablet personal computer (PC), a smartwatch, a watch phone, a mobile communication terminal, an electronic notebook, an electronic book, a portable multimedia player (PMP), a navigation device, or an ultra-mobile PC (UMPC)), but also for various other products, such as a television (TV), a notebook computer, a monitor, a billboard, and an Internet of Things (IoT) device. The display device 10 may be one of an organic light-emitting diode (OLED) display device, a liquid crystal display (LCD) device, a plasma display panel (PDP) device, a field emission display (FED) device, an electrophoretic display (EPD) device, an electrowetting display device, a quantum dot light-emitting diode (QLED) display device, and a micro light-emitting diode (mLED) display device. The display device 10 will hereinafter be described as being an OLED display device, but the inventive concepts are not limited thereto.

The display device 10 has a rectangular shape in a plan view. For example, as illustrated in FIGS. 1 and 2, the display device 10 has a rectangular shape with short sides extending in a first direction (or the X-axis direction) and long sides extending in a second direction (or the Y-axis direction) in a plan view. The corners at which the short sides and the long sides of the display device 10 meet may be rounded with a predetermined curvature or may be right-angled. However, the planar shape of the display device 10 is not particularly limited, and the display device 10 of the inventive concepts may have various shapes other than a rectangular shape, such as another polygonal shape, a circular shape, or an elliptical shape, in a plan view.

The display device 10 may include a first region DR1, which is flat, and second regions DR2, which extend from the left and right sides of the first region DR1. The second regions DR2 may be flat or curved. In a case where the second regions DR2 are flat, the angle that the first region DR1 and the second regions DR2 form may be an obtuse angle. In a case where the second regions DR2 are curved, the second regions DR2 may have a uniform or varying curvature.

FIG. 1 illustrates that the second regions DR2 extend from the left and right sides of the first region DR1, but the inventive concepts are not limited thereto. That is, alternatively, the second regions DR2 may extend from only one of the left and right sides of the first region DR1. Still alternatively, the second regions DR2 may extend not only from the left and right sides, but also from one of the top and bottom sides of the first region DR1. The second regions DR2 will hereinafter be described as being disposed on the left and right sides of the display device 10.

In some exemplary embodiments, the display device 10 includes the display panel 100, a display driving circuit 200, a circuit board 300, and a touch driving circuit 400.

The display panel 100 may include a main area MA and a protruding area PA that protrudes from one side of the main area MA.

The main area MA may include the first region DR1, which is flat, and the second regions DR2, which extend from the left and right sides of the first region DR1, and the main area MA may include a display area DA in which pixels are formed to display an image and a non-display area NDA which is peripheral to the display area DA.

In the display area DA, not only the pixels, but also scan lines, data lines, and a power line connected to the pixels, may be disposed. The display area DA may be disposed in the first region DR1, which is flat, and in the second regions DR2, which extend from the left and right sides of the first region DR1 and are curved. Accordingly, an image displayed by the display panel 100 can be viewed even in the second regions DR2.

The non-display area NDA may be defined as an area ranging from the outer sides of the display area DA to the edges of the display panel 100. In the non-display area NDA, a scan driver 110 may be disposed (FIG. 4) for applying scan signals to the scan lines and link lines for connecting the data lines and the display driving circuit 200.

The protruding area PA may protrude from one side of the main area MA. For example, as illustrated in FIG. 2, the protruding area PA may protrude from the lower side of the main area MA in the opposite direction of the second direction (or the Y-axis direction). The length, in the first direction (or the X-axis direction), of the protruding area PA may be less than the length, in the first direction (or the X-axis direction), of the main area MA.

The protruding area PA may include a bending area BDA and a pad area PDA. The pad area PDA may be disposed on one side of the bending area BDA, and the main area MA may be disposed on the other side of the bending area BDA. For example, the pad area PDA may be disposed on the lower side of the bending area BDA, and the main area MA may be disposed on the upper side of the bending area BDA.

The display panel 100 may be formed to be flexible and may thus be bendable, rollable, or foldable. Accordingly, the display panel 100 can be bent in the bending area BDA in a thickness direction (or the Z-axis direction). The pad area PDA of the display panel 100 may face upward when the display panel 100 is yet to be bent and may face downward when the display panel 100 is bent. When the display panel 100 is bent, the pad area PDA may be placed below the main area MA and may overlap with the main area MA.

In the pad area PDA of the display panel 100, pads that are electrically connected to the display driving circuit 200 and the circuit board 300 may be disposed.

The display driving circuit 200 may output signals and voltages for driving the display panel 100. For example, the display driving circuit 200 may provide data voltages to the data lines. Also, the display driving circuit 200 may provide a power voltage to the power line and may provide scan control signals to the scan driver 110. The display driving circuit 200 may be formed as an integrated circuit (IC) and may then be mounted on the display panel 100, particularly, in the pad area PDA, in a chip-on-glass (COG) or chip-onplastic (COP) manner or through ultrasonic bonding, but the present disclosure is not limited thereto. Alternatively, the display driving circuit 200 may be mounted on the circuit board 300.

The pads may include display pads that are electrically connected to the display driving circuit 200 and touch pads that are electrically connected to touch lines.

The circuit board 300 may be attached to the pads via an anisotropic conductive film. As a result, the lead lines of the circuit board 300 can be electrically connected to the pads. The circuit board 300 may be a flexible film such as a flexible printed circuit board (FPCB), a printed circuit board (PCB), or a chip-on-film (COF).

The touch driving circuit 400 may be connected to touch electrodes of a touch sensor layer TSL of the display panel 100. The touch driving circuit 400 applies driving signals to the touch electrodes of the touch sensor layer TSL and measures the capacitances of the touch electrodes. The driving signals may be signals having multiple driving pulses. The touch driving circuit 400 can not only determine the presence of touch input, but can also calculate the touch coordinates of touch input, based on the capacitances of the touch electrodes.

The touch driving circuit 400 may be disposed on the circuit board 300. The touch driving circuit 400 may be formed as an IC and may then be mounted on the circuit board 300.

Figure 3:
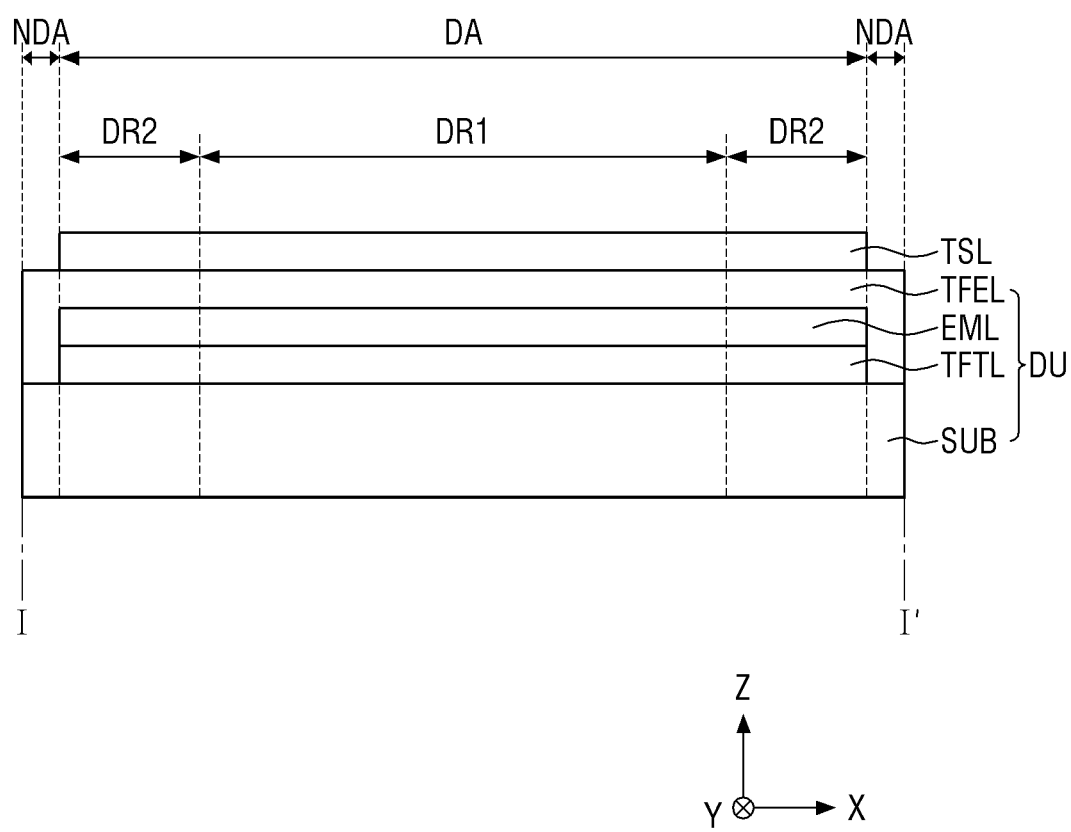
FIG. 3 is a cross-sectional view taken along line I-I' of FIG. 2.

FIG. 3 is a cross-sectional view taken along line I-I' of FIG. 2.

Referring to FIG. 3, the display panel 100 may include a display unit DU and the touch sensor layer TSL, which is disposed on the display unit DU, and the display unit DU may include a substrate SUB, a thin-film transistor (TFT) layer TFTL, a light-emitting element layer EML, and a thin-film encapsulation layer TFEL.

The substrate SUB may be formed of an insulating material such as glass, quartz, or a polymer resin. For example, the substrate SUB may include polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or a combination thereof. In another example, the substrate SUB may include a metal material.

The substrate SUB may be a rigid substrate or may be a flexible substrate that is bendable, foldable, or rollable. In a case where the substrate SUB is a flexible substrate, the substrate SUB may be formed of PI, but the inventive concepts are not limited thereto.

Figure 4:
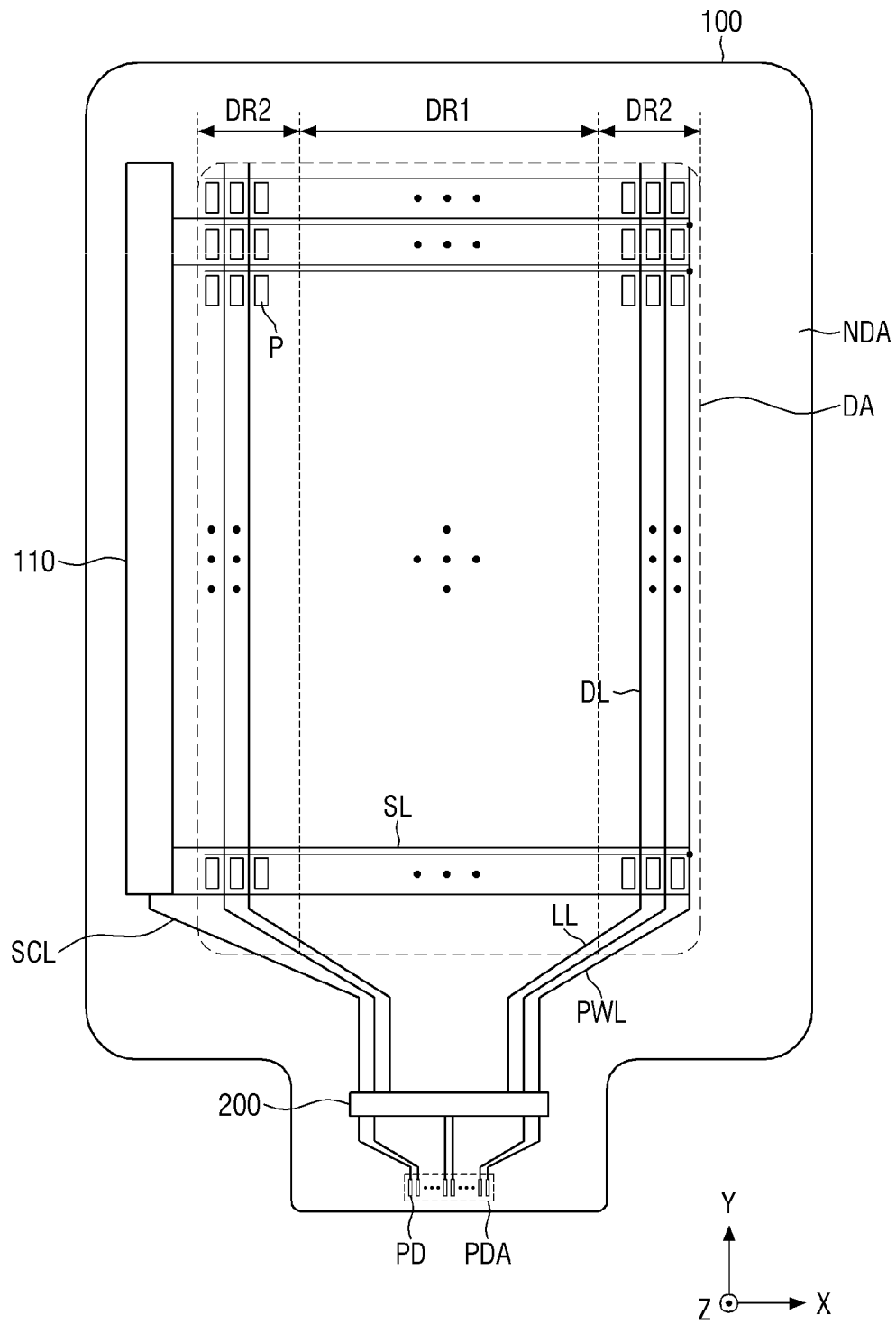
FIG. 4 is a layout view illustrating a display unit of FIG. 3.

The TFT layer TFTL may be disposed on the substrate SUB. In the TFT layer TFTL, not only the TFTs of the pixels, but also the scan lines, the data lines, the power line, scan control lines, and routing lines connecting the pads and the data lines, may be formed. Each of the TFTs may include a gate electrode, a semiconductor layer, a source electrode, and a drain electrode. In a case where the scan driver 110 is formed in the non-display area NDA of the display panel 100, as illustrated in FIG. 4, the scan driver 110 may include the TFTs.

The TFT layer TFTL may be disposed in the display area DA and in the non-display area NDA. Specifically, the TFTs of the pixels, the scan lines, the data lines, and the power line may be disposed in the first region DR1 and the second regions DR2 of the display area DA. The scan control lines and the link lines may be disposed in the non-display area NDA.

The light-emitting element EML may be disposed on the TFT layer TFTL. The light-emitting element layer EML may include the pixels, each having a first electrode, a light-emitting layer, and a second electrode, and a bank layer defining the pixels. The light-emitting layer may include an organic material. In this case, the light-emitting layer may include a hole transport layer, an organic light-emitting layer, and an electron transport layer. In response to a predetermined voltage being applied to the first electrode and a cathode voltage being applied to the second electrode, holes and electrons may move to the organic light-emitting layer through the hole transport layer and the electron transport layer and may be combined together to emit light. The pixels of the light-emitting layer EML may be disposed in the display area DA.

The thin-film encapsulation layer TFEL may be disposed on the light-emitting element layer EML. The thin-film encapsulation layer TFEL prevents oxygen or moisture from infiltrating into the light-emitting element layer EML. To this end, the thin-film encapsulation layer TFEL may include at least one inorganic film. The inorganic film may be a silicon nitride layer, a silicon oxynitride layer, a silicon oxide layer, a titanium oxide layer, or an aluminum oxide layer, but the present disclosure is not limited thereto. Also, the thin-film encapsulation layer TFEL protects the light-emitting element layer EML against foreign materials, such as dust. To this end, the thin-film encapsulation layer TFEL may include at least one organic film. The organic film may include an acrylic resin, an epoxy resin, a phenolic resin, a polyamide resin, or a polyimide resin, but the inventive concepts are not limited thereto.

The thin-film encapsulation layer TFEL may be disposed in both the display area DA and the non-display area NDA. Specifically, the thin-film encapsulation layer TFEL may be disposed to cover the light-emitting element layer EML in both the display area DA and the non-display area NDA and to cover the TFT layer TFTL in the non-display area NDA.

The touch sensor layer TSL may be disposed on the thin-film encapsulation layer TFEL. Since the touch sensor layer TSL can be disposed directly on the thin-film encapsulation layer TFEL, the thickness of the display device 10 can be reduced as compared to a case where an additional touch panel including the touch sensor layer TSL is attached to the thin-film encapsulation layer TFEL.

The touch sensor layer TSL may include touch electrodes for detecting touch input from a user in a capacitive manner and touch lines connecting the touch electrodes. For example, the touch sensor layer TSL may detect touch input from the user in a self-capacitance manner or a mutual capacitance manner.

Figure 5:
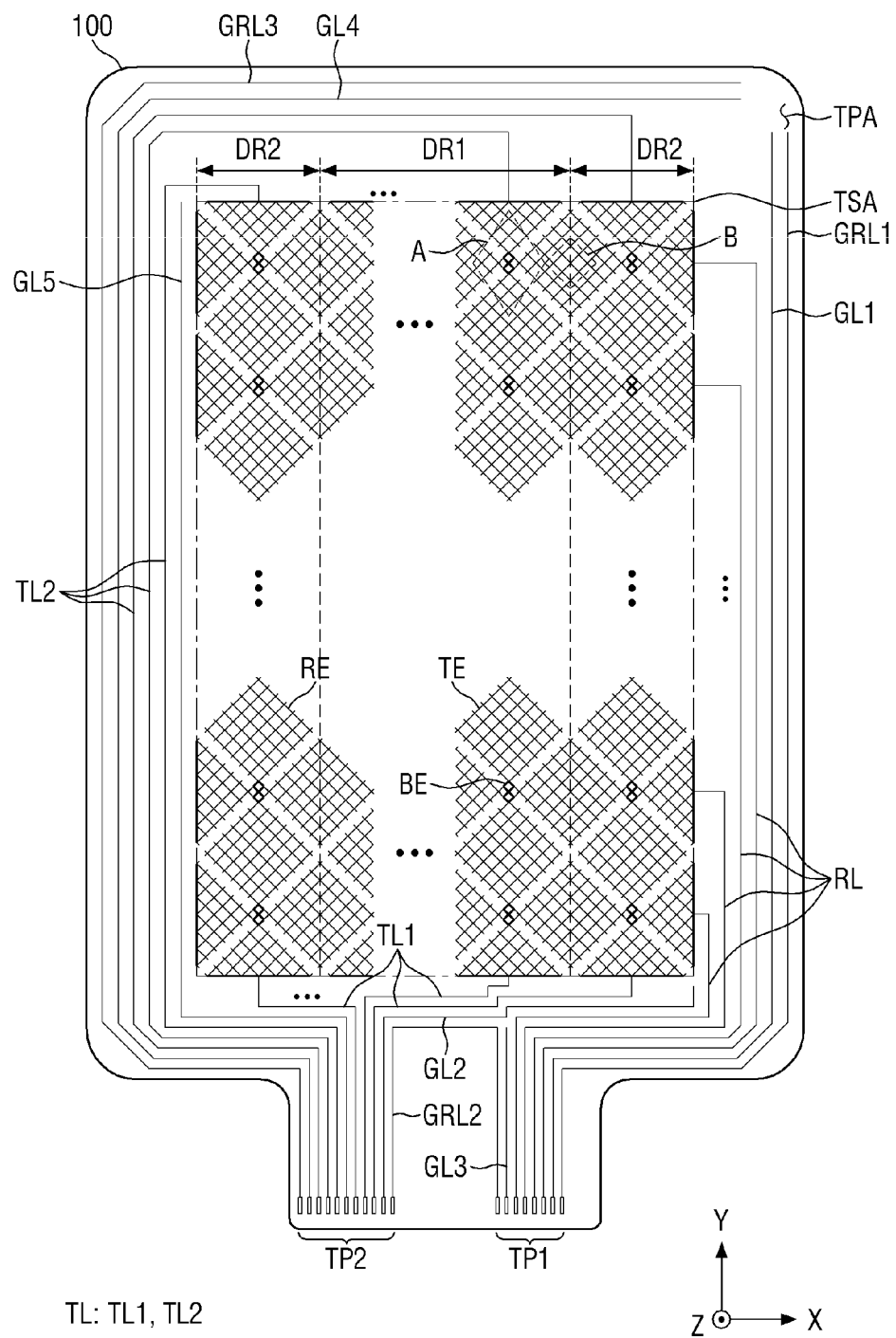
FIG. 5 is a layout view illustrating a touch sensor layer of FIG. 3.

The touch electrodes of the touch sensor layer TSL may be disposed in a touch sensor area TSA that overlaps with the display area DA, as illustrated in FIG. 5. For example, the touch sensor area TSA may be disposed in the first region DR1, which is flat, and in the second regions DR2, which extend from the left and right sides of the first region DR1 and are curved. The touch lines of the touch sensor layer TSL may be disposed in a touch peripheral area TPA that overlaps with the non-display area NDA, as illustrated in FIG. 5.

A cover window may be additionally disposed on the touch sensor layer TSL, in which case, a light path changing layer TRL and the cover window may be attached together via a transparent adhesive member such as an optically clear adhesive (OCA) film.

FIG. 4 is a layout view illustrating the display unit of FIG. 3.

For convenience, FIG. 4 only illustrates pixels P, scan lines SL, data lines DL, a power line PWL, scan control lines SCL, the scan driver 110, the display driving circuit 200, and display pads PD.

Referring to FIG. 4, the scan lines SL, the data lines DL, the power lines PWL, and the pixels P are disposed in the display area DA. For example, the scan lines SL, the data lines DL, the power line PWL, and the pixels P may be disposed in both the first region DR1, which is flat, and the second regions DR2, which extend from the left and right sides of the first region DR1 and are curved.

The scan lines SL may be formed to be parallel to one another in the first direction (or the X-axis direction), and the data lines DL may be formed to be parallel to one another in the second direction (or the Y-axis direction), which intersects the first direction (or the X-axis direction). The power line PWL may include at least one line extending in parallel to the data lines DL in the second direction (or the Y-axis direction) and a plurality of lines branched off from the at least one line in the first direction (or the X-axis direction).

Each of the pixels P may be connected to one of the scan lines SL, one of the data lines DL, and the power line PWL. Each of the pixels P may include TFTs, an OLED, and a capacitor, and the TFTs may include a driving transistor and at least one switching transistor. In response to a scan signal being applied from the scan lines SL, the pixels P may receive data voltages from the data lines DL and may emit light by applying driving currents to the OLEDs thereof in accordance with the data voltages applied to the gate electrodes thereof.

The scan driver 110 may be connected to the display driving circuit 200 via at least one scan control line SCL. Accordingly, the scan driver 110 can receive scan control signals from the display driving circuit 200. The scan driver 110 may generate scan signals in accordance with the scan control signals and may provide the scan signals to the scan lines SL.

FIG. 4 illustrates that the scan driver 110 is disposed in a part of the non-display area NDA on the left side the display area DA, but the present disclosure is not limited thereto. Alternatively, the scan driver 110 may be disposed not only in the part of the non-display area NDA on the left side the display area DA, but also in a part of the non-display area NDA on the right side of the display area DA.

The display driving circuit 200 is connected to the display pads PD and receives digital video data and timing signals. The display driving circuit 200 converts the digital video data into positive/negative analog data voltages and provides the positive/negative analog data voltages to the data lines DL via the link lines LL. Also, the display driving circuit 200 generates scan control signals for controlling the scan driver 110 and provides the scan control signals via the scan control lines SCL. Pixels P to which data voltages are to be provided are selected by scan signals from the scan driver 110, and data voltages are provided to the selected pixels P. The display driving circuit 200 may be formed as an IC and may be attached to the substrate SUB in a COG or COP manner or through ultrasonic bonding.

FIG. 5 is a layout view illustrating the touch sensor layer of FIG. 3.

For convenience, FIG. 5 only illustrates touch electrodes (TE and RE), touch lines (TL and RL), and touch pads TP.

Referring to FIG. 5, the touch sensor layer TSL includes the touch sensor area TSA, which is for detecting touch input from the user, and the touch peripheral area TPA, which disposed near the touch sensor area TSA. In some exemplary embodiments, the touch sensor area TSA may overlap with the display area DA of the display unit DU. For example, the touch sensor area TSA may overlap with the first region DR1, which is flat, and may also overlap with the second regions DR2, which extend from the left and right sides of the first region DR1 and are curved, but the present disclosure is not limited thereto. In another example, the touch sensor area TSA may overlap only with the first region DR1, which is flat. In some exemplary embodiments, the touch peripheral area TPA may overlap with the non-display area NDA of the display unit DU, but the inventive concepts are not limited thereto. In some exemplary embodiments, the touch peripheral area TPA may overlap with a part of the display area DA of the display unit DU.

In some exemplary embodiments, the touch electrodes (TE and RE) may be disposed in the touch sensor area TSA. The touch electrodes (TE and RE) may include sensing electrodes RE that are electrically connected in the first direction (or the X-axis direction) and driving electrodes TE that are electrically connected in the second direction (or the Y-axis direction), which intersects the first direction (or the X-axis direction). FIG. 5 illustrates that the sensing electrodes RE and the driving electrodes TE have a diamond shape in a plan view, but the inventive concepts are not limited thereto.

In order to prevent the sensing electrodes RE and the driving electrodes TE from being short-circuited at the intersections therebetween, the driving electrodes TE may be electrically connected to one another in the second direction (or the Y-axis direction) via connecting electrodes BE. In this case, the driving electrodes TE and the sensing electrodes RE may be disposed in the same layer, and the connecting electrodes BE may be disposed in a different layer from the driving electrodes TE and the sensing electrodes RE. Also, the sensing electrodes RE, which are electrically connected in the first direction (or the X-axis direction), may be electrically insulated from the driving electrodes TE, which are electrically connected in the second direction (or the Y-axis direction).

In some exemplary embodiments, the touch lines (TL and RL) may be disposed in the touch peripheral area TPA. The touch lines (TL and RL) may include sensing lines RL that are connected to the sensing electrodes RE, and first driving lines TL1 and second driving lines TL2 that are connected to the driving electrodes TE.

Sensing electrodes RE disposed in a right part of the touch sensor area TSA may be connected to the sensing lines RL. For example, sensing electrodes RE disposed at the right end of the touch sensor area TSA may be connected to the sensing lines RL. The sensing lines RL may be connected to the first touch pads TP1. Accordingly, the touch driving circuit 400 can be electrically connected to the sensing electrodes RE.

Driving electrodes TE disposed in a lower part of the touch sensor area TSA may be connected to the first driving lines TL1, and driving electrodes TE disposed in an upper part of the touch sensor area TSA may be connected to the second driving lines TL2. For example, driving electrodes TE disposed at the lower end of the touch sensor area TSA may be connected to the first driving lines TL1, and driving electrodes TE disposed at the upper end of the touch sensor area TSA may be connected to the second driving lines TL2. The second driving lines TL2 may be connected to the driving electrodes TE in the upper part of the touch sensor area TSA by passing through a left part of the touch peripheral area on the outside of the touch sensor area TSA. The first driving liens TL1 and the second driving lines TL2 may be connected to the second touch pads TP2. Accordingly, the touch driving circuit 400 can be electrically connected to the driving electrodes TE.

The touch electrodes (TE and RE) may be driven in the mutual capacitance manner or in the self-capacitance manner. In a case where the touch electrodes (TE and RE) are driven in the mutual capacitance manner, driving signals may be provided to the driving electrodes TE via the first driving lines TL1 and the second driving lines TL2 to charge mutual capacitances at the intersections between the sensing electrodes RE and the driving electrodes TE. Then, charge variations in the sensing electrodes RE may be measured via the sensing lines RL, and the presence of touch input may be determined based on the measured charge variations. Here, the driving signals may be signals having multiple driving pulses.

In a case where the touch electrodes (TE and RE) are driven in the self-capacitance manner, driving signals may be provided to both the driving electrodes TE and the sensing electrodes RE via the first driving lines TL1, the second driving lines TL2, and the sensing lines RL to charge self-capacitances of the driving electrodes TE and the sensing electrodes RE. Then, charge variations in the driving electrodes TE and the sensing electrodes RE may be measured via the first driving lines TL1, the second driving lines TL2, and the sensing lines RL, and the presence of touch input may be determined based on the measured charge variations.

The driving electrodes TE, the sensing electrodes RE, and the connecting electrodes BE may be formed as mesh-type electrodes, as illustrated in FIG. 5. In a case where the touch sensor layer TSL including the driving electrodes TE and the sensing electrodes RE is formed directly on the thin-film encapsulation layer TFEL, as illustrated in FIG. 3, very large parasitic capacitances may be formed between the second electrode of the light-emitting element layer EML and the driving electrodes TE (or the sensing electrodes RE) of the touch sensor layer TSL because the second electrode of the light-emitting element layer EML is very close to the driving electrodes TE (or the sensing electrodes RE) of the touch sensor layer TSL. Thus, in order to reduce the parasitic capacitances, the driving electrodes TE and the sensing electrodes RE may be formed as mesh-type electrodes, as illustrated in FIG. 5, rather than as non-pattern electrodes of a transparent oxide conductive layer including indium tin oxide (ITO) or indium zinc oxide (IZO).

A first guard line GL1 may be disposed on the outside of the outermost sensing line RL. Also, a first ground line GRL1 may be disposed on the outside of the first guard line GL1. That is, the first guard line GL1 may be disposed on the right side of the rightmost sensing line RL, and the first ground line GRL1 may be disposed on the right side of the first guard line GL1.

A second guard line GL2 may be disposed between the innermost sensing line RL and the rightmost first driving line TL1. The second guard line GL2 may be disposed between the rightmost first driving line TL1 and the second ground line GRL2. Also, the third guard line GL3 may be disposed between the innermost sensing line RL and the second guard line GRL2. The second ground line GRL2 may be connected to the leftmost first touch pad TP1 and the rightmost second touch pad TP2.

A fourth guard line GL4 may be disposed on the outside of the outermost second driving line TL2. Also, a third ground line GRL3 may be disposed on the outside of the fourth guard line GL4. That is, the fourth guard line GL4 may be disposed on the left and upper sides of the outermost second driving line TL2, and the third ground line GRL3 may be disposed on the left and upper sides of the fourth guard line GL4.

A fifth guard line GL5 may be disposed on the inside of the innermost second driving line TL2. That is, the fifth guard line GL5 may be disposed between the rightmost second driving line TL2 and the touch electrodes (TE and RE).

According to the exemplary embodiment of FIG. 5, the first, second, and third ground lines GRL1, GRL2, and GRL3 may be respectively disposed in uppermost, leftmost, and rightmost parts of the display panel 100. A ground voltage is applied to the first, second, and third ground lines GRL1, GRL2, and GRL3. Accordingly, when an external static electricity is applied, the external static electricity can be discharged to the first, second, and third ground lines GRL1, GRL2, and GRL3.

Also, according to the exemplary embodiment of FIG. 5, since the first guard line GL1 is disposed between the outermost sensing line RL and the first ground line GRL1, the influence of voltage variations in the first ground line GRL1 on the outermost sensing line RL can be minimized. Since the second guard line GL2 is disposed between the innermost sensing line RL and the outermost first driving line TL1, the influence of voltage variations on the innermost sensing line RL and on the outermost first driving line TL1 can be minimized. Since the third guard line GL3 is disposed between the innermost sensing line RL and the second ground line GRL2, the influence of voltage variations in the second ground line GRL2 on the innermost sensing line RL can be minimized. Since the fourth guard line GL4 is disposed between the outermost second driving line TL2 and the third ground line GRL3, the influence of voltage variations in the third ground line GRL3 on the outermost second driving line TL2 can be minimized. Since the fifth guard line GL5 is disposed between the innermost second driving line TL2 and the touch electrodes (TE and RE), the influence of the innermost second driving line TL2 and the touch electrodes (TE and RE) on one another can be minimized.

In a case where the touch electrodes (TE and RE) are driven in the mutual-capacitance manner, a ground voltage may be applied to the first, second, third, fourth, and fifth guard lines GL1, GL2, GL3, GL4, and GL5. In a case where the touch electrodes (TE and RE) are driven in the self-capacitance manner, the same driving signals as those applied to the first driving lines TL1, the second driving lines TL2, and the sensing lines RL may be applied to the first, second, third, fourth, and fifth guard lines GL1, GL2, GL3, GL4, and GL5.

Figure 6:
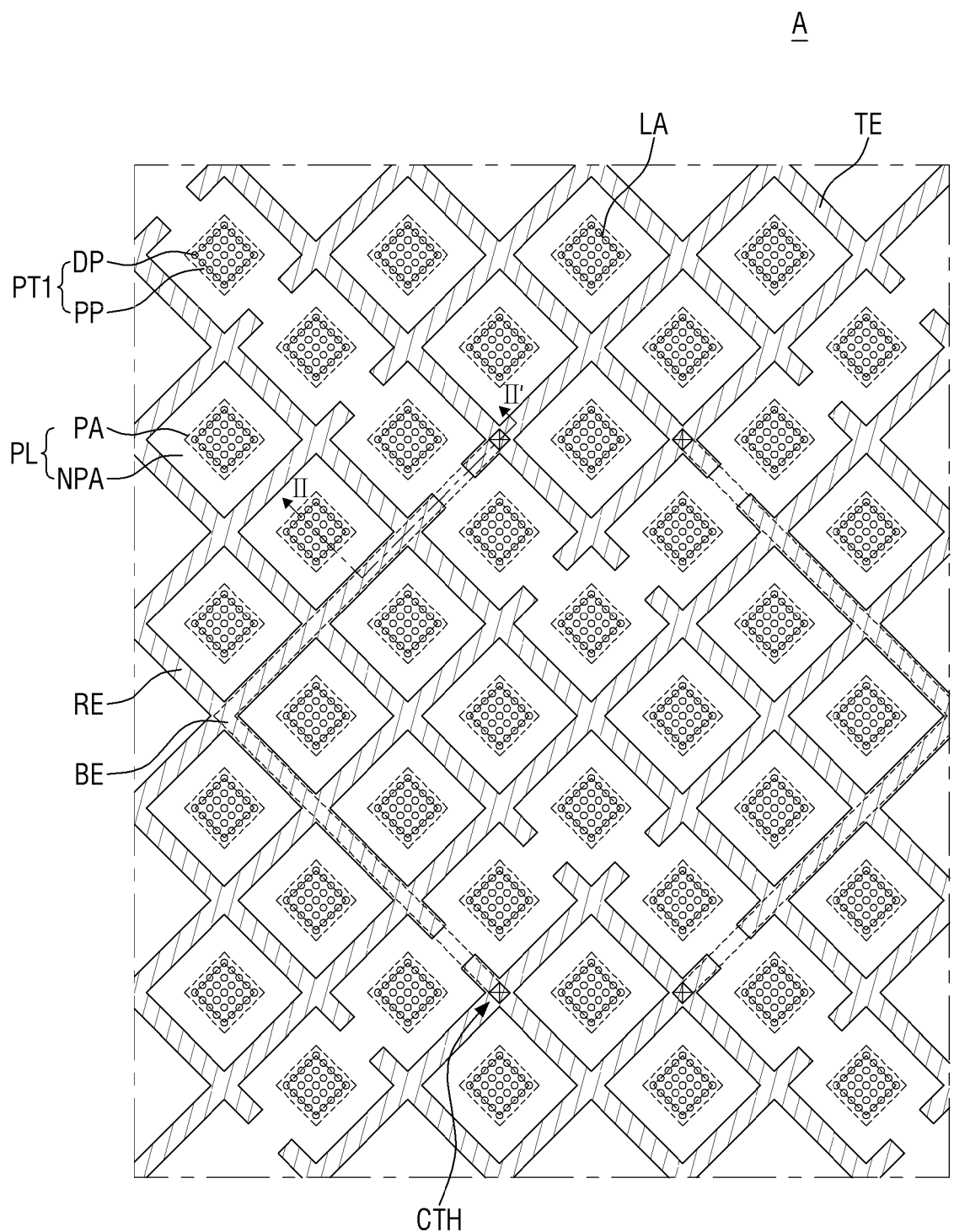
FIG. 6 is an enlarged view illustrating an area A of FIG. 5.
Figure 7:
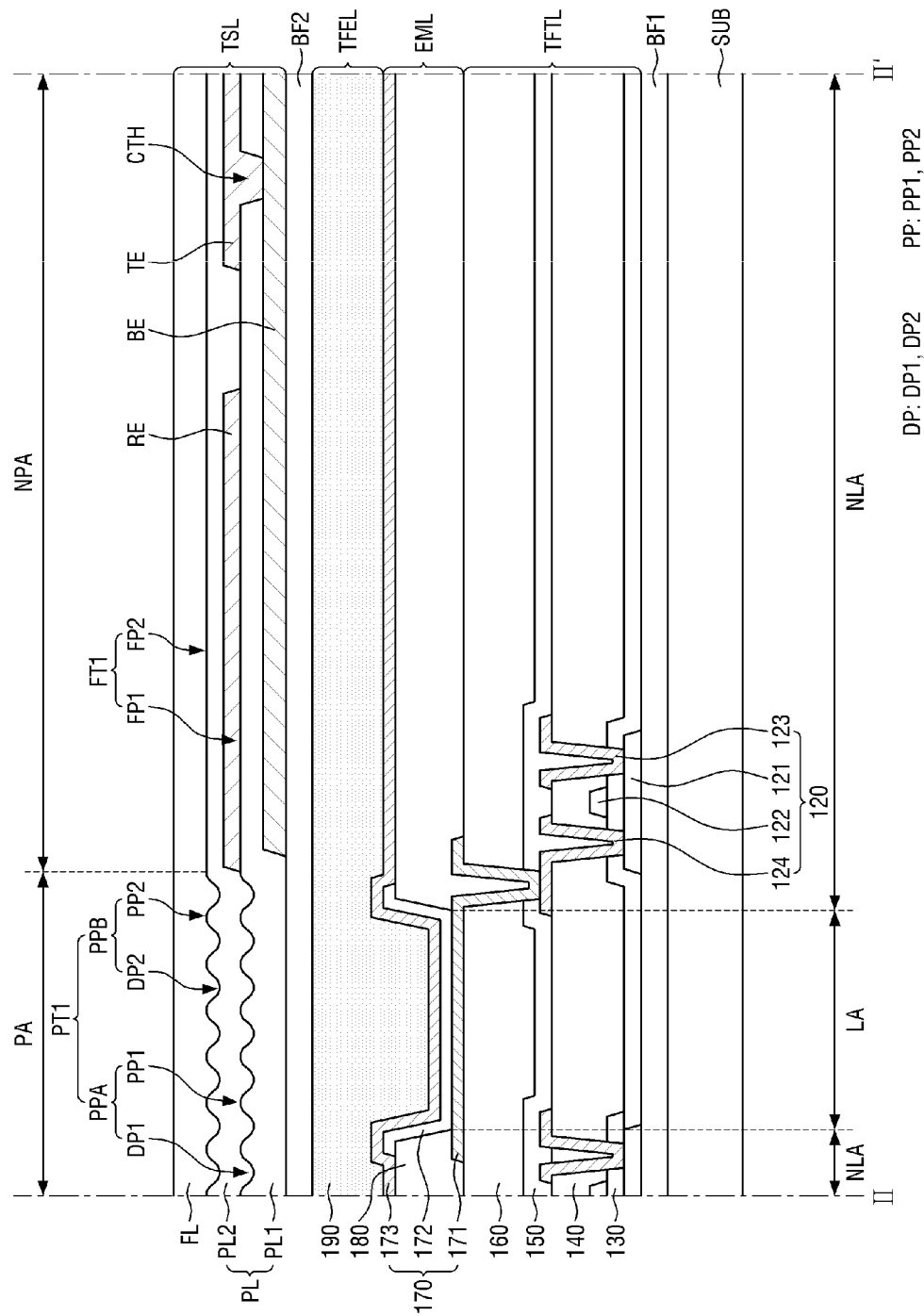
FIG. 7 is a cross-sectional view taken along line II-IF of FIG. 6.

FIG. 6 is an enlarged view illustrating an area A of FIG. 5, and FIG. 7 is a cross-sectional view taken along line II-IF of FIG. 6.

Referring to FIG. 6, the touch sensor layer TSL may include the touch electrodes (TE and RE), the connecting electrodes BE, and a high refractive index layer PL.

In some exemplary embodiments, the touch electrodes (TE and RE) of the touch sensor layer TSL may have a mesh shape surrounding light-emitting areas LA. The light-emitting areas LA may be regions that release light generated in the light-emitting element layer EML of the display unit DU. In some exemplary embodiments, the light-emitting areas LA may display first, second, and third colors which are different from one another, and the first, second, and third colors may be red, green, and blue, respectively. However, the inventive concepts are not limited to this. In some exemplary embodiments, the light-emitting areas LA may all display the same color, for example, the first color, or may display first, second, third, and fourth colors which are different from one another.

FIG. 6 illustrates that the light-emitting areas LA have a rhombic shape in a plan view, but the inventive concepts are not limited thereto. That is, in a plan view, the first light-emitting areas LA may have a rectangular or square shape or may have another polygonal shape or a circular or elliptical shape. The light-emitting areas LA may have different shapes.

FIG. 6 illustrates that the light-emitting area LA all have the same size in a plan view, but the inventive concepts are not limited thereto. In some exemplary embodiments, the light-emitting areas LA may have different sizes in a plan view. For example, in a plan view, the size of light-emitting areas LA emitting red light may be greater than the size of light-emitting areas LA emitting green light, and the size of light-emitting areas LA emitting blue light may be greater than the size of the light-emitting areas LA emitting green light. Also, in some exemplary embodiments, in a plan view, the size of the light-emitting areas LA may be substantially the same as, or smaller than, the size of the light-emitting areas LA emitting blue light.

The high refractive index layer PL includes pattern areas PA and non-pattern areas NPA. The pattern areas PA are areas in which pattern parts are disposed, and the non-pattern areas NPA may be areas in which the pattern parts are not disposed. FIG. 6 only illustrates first pattern parts PT1, but the pattern parts include not only the first pattern parts PT1, which are disposed in the first region DR1, but also second pattern parts PT2, which are disposed in the second regions DR2. The first pattern parts PT1 and the second pattern parts PT2 will be described later in detail.

The connecting electrodes BE may be bent at least once in the shape of "<" or ">" in a plan view, but the inventive concepts are not limited thereto. The connecting electrodes BE may be disposed to overlap with the touch electrodes (TE and RE). In areas where the connecting electrodes BE overlap with the driving electrodes TE, the connecting electrodes BE may be connected to the driving electrodes TE via contact holes CTH.

Referring to FIG. 7, the TFT layer TFTL is formed on the substrate SUB. The TFT layer TFTL includes TFTs 120, a gate insulating film 130, an interlayer insulating film 140, a passivation film 150, and a planarization film 160.

A first buffer layer BF1 may be formed on the substrate SUB. The first buffer layer BF1 may be formed on the substrate SUB to protect the TFTs 120 and an organic light-emitting layer 172 of the light-emitting element layer EML against moisture that may penetrate the substrate SUB. The first buffer layer BF1 may include a plurality of inorganic films that are alternately stacked. For example, the first buffer layer BF1 may be formed as a multilayer film in which at least one of a silicon nitride layer, a silicon oxynitride layer, a silicon oxide layer, a titanium oxide layer, and an aluminum oxide layer is alternately stacked. The first buffer layer BF1 may not be provided.

The TFTs 120 may be formed on the first buffer layer BF1. Each of the TFTs 120 includes an active layer 121, a gate electrode 122, a source electrode 123, and a drain electrode 124. FIG. 7 illustrates that the TFTs 120 have a top gate structure in which the gate electrode 122 is disposed above the active layer 121, but the inventive concepts are not limited thereto. That is, the TFTs 120 may have a bottom gate structure in which the gate electrode 122 is disposed below the active layer 121 or a double gate structure in which the gate electrode 122 is disposed both above and below the active layer 121.

The active layer 121 is formed on the first buffer layer BF1. The active layer 121 may include polycrystalline silicon, monocrystalline silicon, low-temperature polycrystalline silicon, amorphous silicon, or an oxide semiconductor. For example, the oxide semiconductor may be a binary compound ($AB_x$), a ternary compound ($AB_xC_y$), or a quaternary compound ($AB_xC_yD_z$) including indium (In), zinc (Zn), gallium (Ga), tin (Sb), titanium (Ti), aluminum (Al), hafnium (Hf), zirconium (Zr), or magnesium (Mg). For example, the active layer 121 may include indium tin zinc oxide (ITZO) or indium gallium zinc oxide (IGZO). A light-shielding layer for blocking external light incident upon the active layer 121 may be formed between the first buffer layer BF1 and the active layer 121.

The gate insulating film 130 may be formed on the active layer 121. The gate insulating film 130 may be formed as an inorganic film such as, for example, a silicon nitride layer, a silicon oxynitride layer, a silicon oxide layer, a titanium oxide layer, or an aluminum oxide layer.

The gate electrode 122 and a gate line may be formed on the gate insulating film 130. The gate electrode 122 and the gate line may be formed as single- or multilayer films using molybdenum (Mo), Al, chromium (Cr), gold (Au), Ti, nickel (Ni), neodymium (Nd), copper (Cu), or an alloy thereof.

The interlayer insulating film 140 may be formed on the gate electrode 122 and the gate line. The interlayer insulating film 140 may be formed as an inorganic film such as, for example, a silicon nitride layer, a silicon oxynitride layer, a silicon oxide layer, a titanium oxide layer, or an aluminum oxide layer.

The source electrode 123 and the drain electrode 124 may be formed on the interlayer insulating film 140. The source electrode 123 and the drain electrode 124 may be connected to the active layer 121 via contact holes that penetrate the gate insulating film 130 and the interlayer insulating film 140. The source electrode 123 and the drain electrode 124 may be formed as single- or multilayer films using Mo, Al, Cr, Au, Ti, Ni, Nd, Cu, or an alloy thereof.

The passivation film 150, which is for insulating the TFTs 120, may be formed on the source electrode 123 and the drain electrode 124. The passivation film 150 may be formed as an inorganic film such as, for example, a silicon nitride layer, a silicon oxynitride layer, a silicon oxide layer, a titanium oxide layer, or an aluminum oxide layer.

The planarization film 160, which is for planarizing height differences generated by the TFTs 120, may be formed on the passivation film 150. The planarization film 160 may be formed as an organic film using an acrylic resin, an epoxy resin, a phenolic resin, a polyamide resin, or a polyimide resin.

The light-emitting element layer EML is formed on the TFT layer TFTL. The light-emitting element layer EML includes light-emitting elements 170 and a bank layer 180.

The light-emitting elements 170 and the bank layer 180 are formed on the planarization film 160. Each of the light-emitting elements 170 may include a first electrode 171, the organic light-emitting layer 172, and a second electrode 173.

The first electrode 171 may be formed on the planarization film 160. The first electrode 171 may be connected to the source electrode 123 of each of the TFTs 120 via a contact hole that penetrates the passivation film 150 and the planarization film 160.

In a case where the light-emitting element layer EML is formed as a top emission-type light-emitting element layer that emits light in a direction toward the second electrode 173 with respect to the organic light-emitting layer 172, the first electrode 171 may be formed of a metal material with high reflectance, such as a stack of Al and Ti (e.g., Ti/Al/Ti), a stack of Al and ITO (e.g., ITO/Al/ITO), a silver (Ag)-palladium (Pd)-copper (Cu) (APC) alloy, or a stack of an APC alloy and ITO (e.g., ITO/APC/ITO).

In a case where the light-emitting element layer EML is formed as a bottom emission-type light-emitting element layer that emits light in a direction toward the first electrode 171 with respect to the organic light-emitting layer 172, the first electrode 171 may be formed of a transparent conductive oxide (TCO) material, such as ITO or IZO, or a semi-transmissive conductive material, such as Mg, Ag, or an alloy thereof. In a case where the first electrode 171 is formed of a semi-transmissive conductive material, emission efficiency can be improved due to micro-cavities.

The bank layer 180 may be formed on the planarization film 160 to define the first electrode 171 and thus, to define the light-emitting areas LA. For example, the bank layer 180 may be formed to cover the edges of the first electrode 171 and may include openings that expose the top surface of the first electrode 171. The bank layer 180 may be formed as an organic film using an acrylic resin, an epoxy resin, a phenolic resin, a polyamide resin, or a polyimide resin.

Each of the light-emitting areas LA may refer to a region in which the first electrode 171, the organic light-emitting layer 172, and the second electrode 173 are sequentially stacked and holes from the first electrode 171 and electrons from the second electrode 173 are combined together in the organic light-emitting layer 172 to emit light. The light-emitting areas LA may include the light-emitting elements 170.

The organic light-emitting layer 172 is formed on the first electrode 171 and on the bank layer 180. The organic light-emitting layer 172 may include an organic material and may emit light of a predetermined color. For example, the organic light-emitting layer 172 may include a hole transport layer, an organic material layer, and an electron transport layer. The organic light-emitting layer 172 may emit light of a first, second, and third color in each of the light-emitting areas LA. The first, second, and third colors may be red, green, and blue, but the inventive concepts are not limited thereto.

Alternatively, the organic light-emitting layer 172 may emit white light in each of the light-emitting areas LA, in which case a color filter may be disposed on the light-emitting element layer EML.

The second electrode 173 is formed on the organic light-emitting layer 172. The second electrode 173 may be formed to cover the organic light-emitting layer 172. The second electrode 173 may be a common layer formed in common for all subpixels (RP, GP, and BP). A capping layer may be formed on the second electrode 173.

In a top emission structure, the second electrode 173 may be formed of a TCO material such as ITO or IZO or a semi-transmissive conductive material such as Mg, Ag, or an alloy thereof. In a case where the second electrode 173 is formed of a semi-transmissive conductive material, emission efficiency can be improved due to micro-cavities.

In a bottom emission structure, the second electrode 173 may be formed of a metal material with high reflectance such as a stack of Al and Ti (e.g., Ti/Al/Ti), a stack of Al and ITO (e.g., ITO/Al/ITO), an APC alloy, or a stack of an APC alloy and ITO (e.g., ITO/APC/ITO).

The thin-film encapsulation layer TFEL is formed on the light-emitting element layer EML. The thin-film encapsulation layer TFEL includes an encapsulation film 190.

The encapsulation film 190 is disposed on the second electrode 173. The encapsulation film 190 may include at least one inorganic film to prevent oxygen or moisture from infiltrating into the organic light-emitting layer 172 and the second electrode 173. Also, the encapsulation film 190 may include at least one organic film to protect the light-emitting element layer EML against foreign materials such as dust. For example, the encapsulation film 190 may include a first inorganic film disposed on the second electrode 173, an organic film disposed on the first inorganic film, and a second inorganic film disposed on the organic film. The first and second inorganic films may be formed as silicon nitride layers, silicon oxynitride layers, silicon oxide layers, titanium oxide layers, or aluminum oxide layers, but the present disclosure is not limited thereto. The organic film may be formed of an acrylic resin, an epoxy resin, a phenolic resin, a polyamide resin, or a polyimide resin, but the inventive concepts are not limited thereto.

A second buffer layer BF2 is formed on the thin-film encapsulation layer TFEL. The second buffer layer BF2 may be formed of silicon nitride ($SiN_x$), but the inventive concepts are not limited thereto. In some exemplary embodiments, the second buffer layer BF2 may include a plurality of inorganic films that are alternately stacked. For example, the second buffer layer BF2 may be formed as a multilayer film in which at least one of a silicon nitride layer, a silicon oxynitride layer, a silicon oxide layer, a titanium oxide layer, and an aluminum oxide layer is alternately stacked.

The touch sensor layer TSL is disposed on the second buffer layer BF2. As already mentioned above with reference to FIG. 5, the touch sensor layer TSL includes the driving electrodes TE, the sensing electrodes RE, the connecting electrodes BE, the driving lines (TL1 and TL2), the sensing lines RL, the guard lines (GL1, GL2, GL3, GL4, and GL5), and the ground lines (GRL1, GRL2, and GRL3). For convenience, FIG. 7 only illustrates a driving electrode TE, a sensing electrode RE, a connecting electrode BE, the high refractive index layer PL, and a planarization layer FL.

Referring to FIG. 7, a connecting electrode BE is disposed on the second buffer layer BF2. The connecting electrode BE may be formed of a stack of Al and Ti (e.g., Ti/Al/Ti), a stack of Al and ITO (e.g., ITO/Al/ITO), an APC alloy, or a stack of an APC alloy and ITO (e.g., ITO/APC/ITO), but the present disclosure is not limited thereto.

The high refractive index layer PL, including a first pattern part PT1 and a first flat part FT1, is disposed on the connecting electrode BE. Specifically, the high refractive index layer PL may include first and second high refractive index layers PL1 and PL2, but the inventive concepts are not limited thereto. Alternatively, the high refractive index layer PL may be formed as a single-layer film or as a multilayer film having three or more layers. The first pattern part PT1 may include first and second concavo-convex portions PPA and PPB, and the first flat part FT1 may include first and second non-concavo-convex portions FP1 and FP2.

Specifically, the first high refractive index layer PL1 may be disposed on the connecting electrode BE and may include the first concavo-convex portion PPA, the first non-concavo-convex portion FP1, and a contact hole CTH that partially exposes the connecting electrode BE. In some exemplary embodiments, the first concavo-convex portion PPA may include a plurality of first depressions DP1 and a plurality of protrusions PP1, but the inventive concepts are not limited thereto. Alternatively, the first concavo-convex portion PPA may include the first depressions DP1 only or may include the protrusions PP1 only. In some exemplary embodiments, the first non-concavo-convex portion FP1 may be flat, but the inventive concepts are not limited thereto. Alternatively, the first non-concavo-convex portion FP1 may be curved or may be disposed along the morphology of the connecting electrode BE. The first concavo-convex portion PPA diffuses external light, and the first non-concavo-convex portion FP1 planarizes a height difference generated by the connecting electrode BE.

A driving electrode TE and a sensing electrode RE may be disposed on the first high refractive index layer PL1. For example, the driving electrode TE and the sensing electrode RE may be disposed on the top surface of the first non-concavo-convex portion FP1 of the first high refractive index layer PL1 to be spaced apart from each other, and the driving electrode TE may be electrically connected to the connecting electrode BE via the contact hole CTH, which is disposed in the first high refractive index layer PL1. The driving electrode TE and the sensing electrode RE may be formed of a stack of Al and Ti (e.g., Ti/Al/Ti), a stack of Al and ITO (e.g., ITO/Al/ITO), an APC alloy, or a stack of an APC alloy and ITO (e.g., ITO/APC/ITO), but the inventive concepts are not limited thereto.

The second high refractive index layer PL2 may be disposed on the first high refractive index layer PL1, on the driving electrode TE, and on the sensing electrode RE. The second high refractive index layer PL2 may include the second concavo-convex portion PPB and the second non-concavo-convex portion FP2. In some exemplary embodiments, the second concavo-convex portion PPB may include a plurality of second depressions DP2 and a plurality of second protrusions PP2. The second depressions DP2 and the second protrusions PP2 of the second concavo-convex portion PPB may be disposed along the morphologies of the first depressions DP1 and the first protrusions PP1 of the first concavo-convex portion PPA, but the inventive concepts are not limited thereto. In some exemplary embodiments, the second depressions DP2 and the second protrusions PP2 of the second concavo-convex portion PPB may have different shapes from the first depressions DP1 and the first protrusions PP1 of the first concavo-convex portion PPA. Also, in some exemplary embodiments, the second concavo-convex portion PPB may include the second depressions DP2 only or may include the second protrusions PP2 only.

The second non-concavo-convex portion FP2 may be flat, but the inventive concepts are not limited thereto. Alternatively, the first non-concavo-convex portion FP1 may be curved or may be disposed along the morphologies of the driving electrode TE and the sensing electrode RE. The second concavo-convex portion PPB diffuses external light, and the second non-concavo-convex portion FP2 planarizes height differences generated by the driving electrode TE and the sensing electrode RE.

The planarization layer FL may be disposed on the second refractive index layer PL2. The planarization layer FL planarizes a height difference generated by the first pattern part PT1. The planarization layer FL may be formed as an organic film using an acrylic resin, an epoxy resin, a phenolic resin, a polyamide resin, or a polyimide resin.

In some exemplary embodiments, the high refractive index layer PL and the planarization layer FL may have different refractive indexes. For example, the refractive index of the high refractive index layer PL may be greater than the refractive index of the planarization layer FL. Also, the refractive index of the second buffer layer BF2 may be greater than the refractive index of the high refractive index layer PL. In some exemplary embodiments, the high refractive index layer PL may have a refractive index of 1.6 to 1.65; the planarization layer FL may have a refractive index of 1.5 to 1.59; and the second buffer layer BF2 may have a refractive index of 1.66 to 1.75. However, the inventive concepts are not limited to this. The first and second high refractive index layers PL1 and PL2 may have the same refractive index, but the inventive concepts are not limited thereto. Alternatively, the first and second high refractive index layers PL1 and PL2 may have different refractive indexes. For example, the refractive index of the second high refractive index layer PL2 may be greater than the refractive index of the first high refractive index layer PL1, or vice versa. Since the high refractive index layer PL includes the first pattern part PT1, the refractive index of the high refractive index layer PL is smaller than the refractive index of the second buffer layer BF2 and greater than the refractive index of the planarization layer FL, external light incident from outside the display device 10 can be diffused, and reflected light that may be visible to the user can be reduced. As a result, the visibility of the display device 10 can be improved.

A light-shielding pattern may be disposed on the planarization layer FL to overlap with the driving electrode TE, the sensing electrode RE, and the connecting electrode BE of the touch sensor layer TSL in the thickness direction, and a polarization member may be further disposed between the light-shielding pattern and the cover window.

Figure 8:
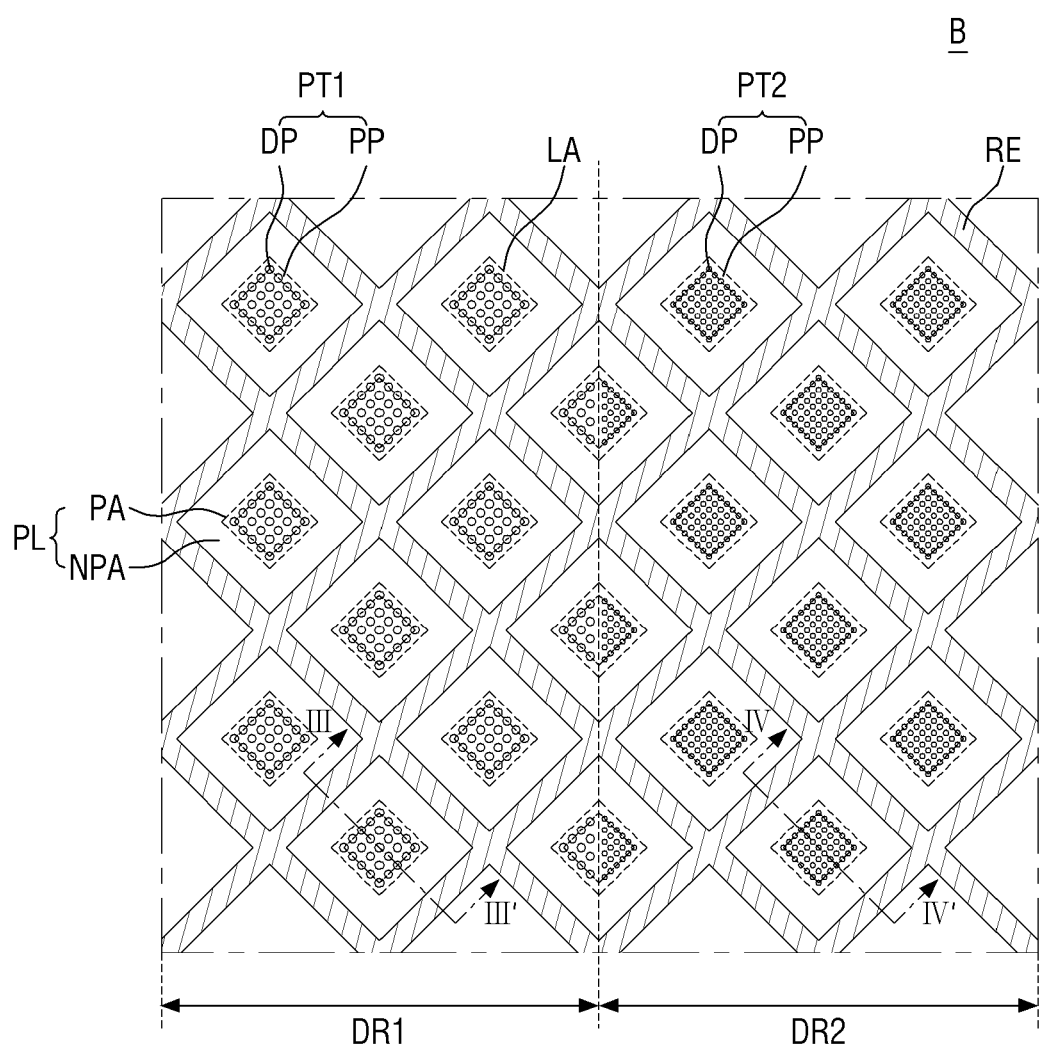
FIG. 8 is an enlarged view illustrating an area B of FIG. 5.
Figure 9:
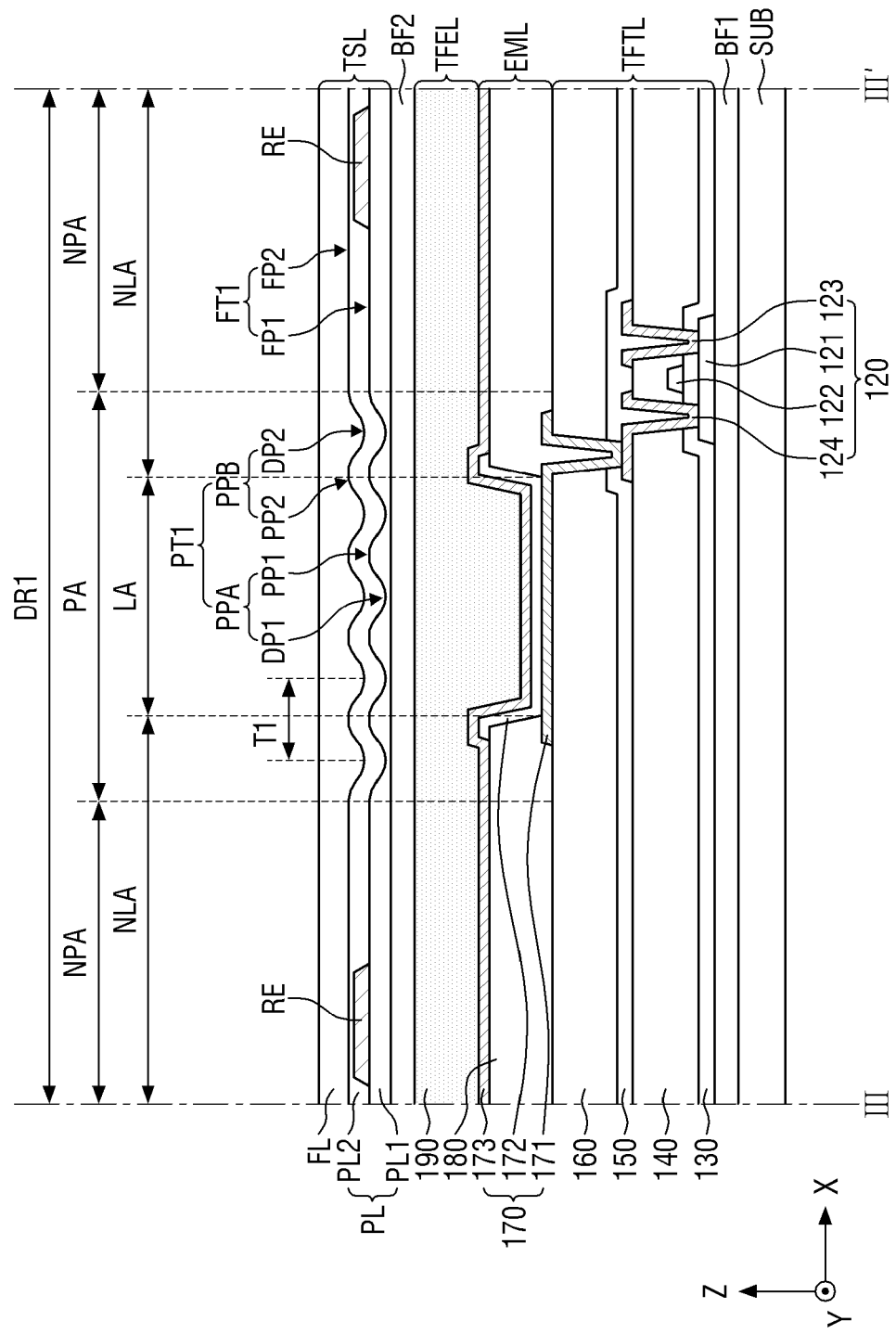
FIG. 9 is a cross-sectional view taken along line of FIG. 8.
Figure 10:
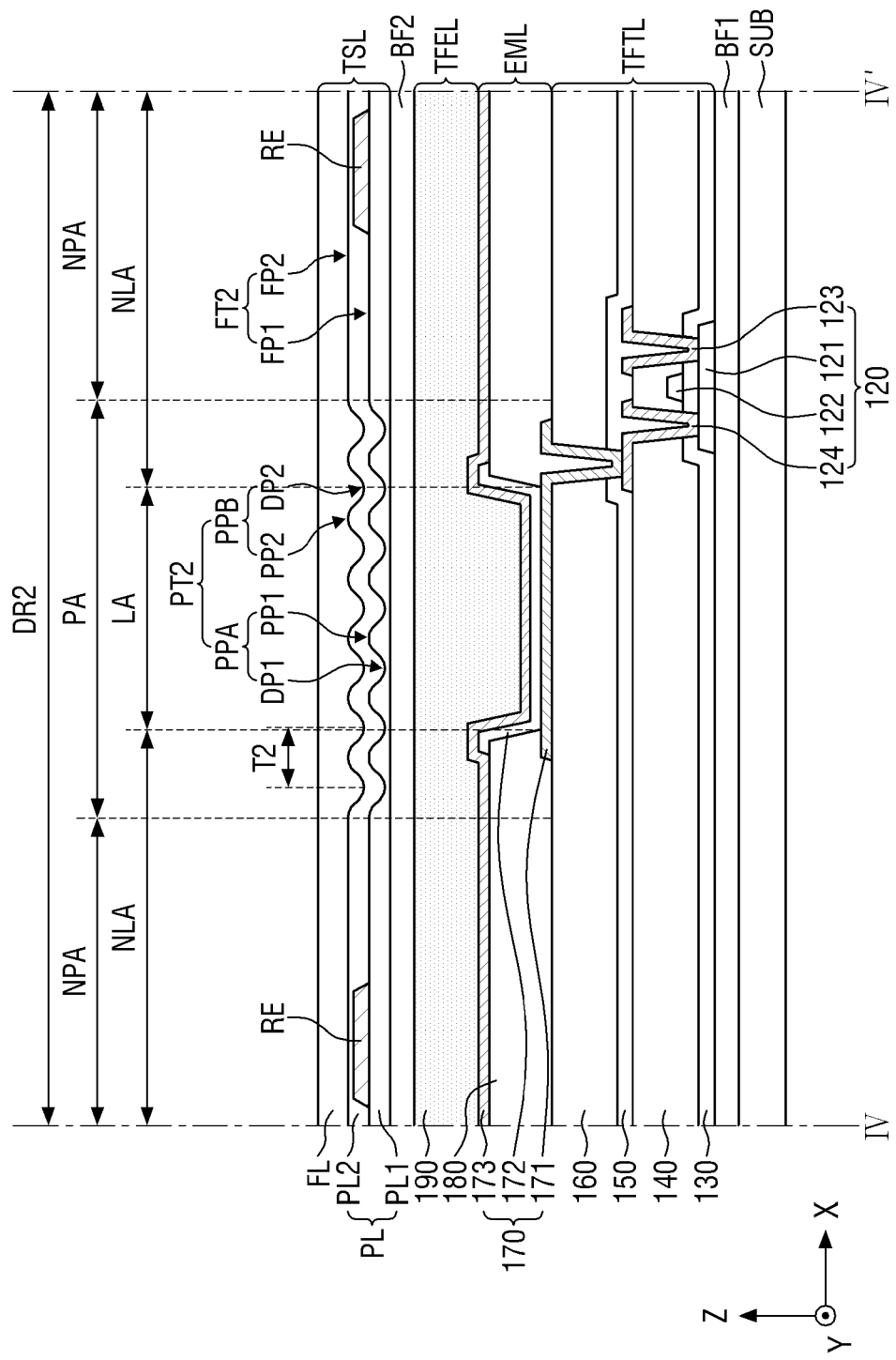
FIG. 10 is a cross-sectional view taken along line IV-IV' of FIG. 8.
Figure 11:
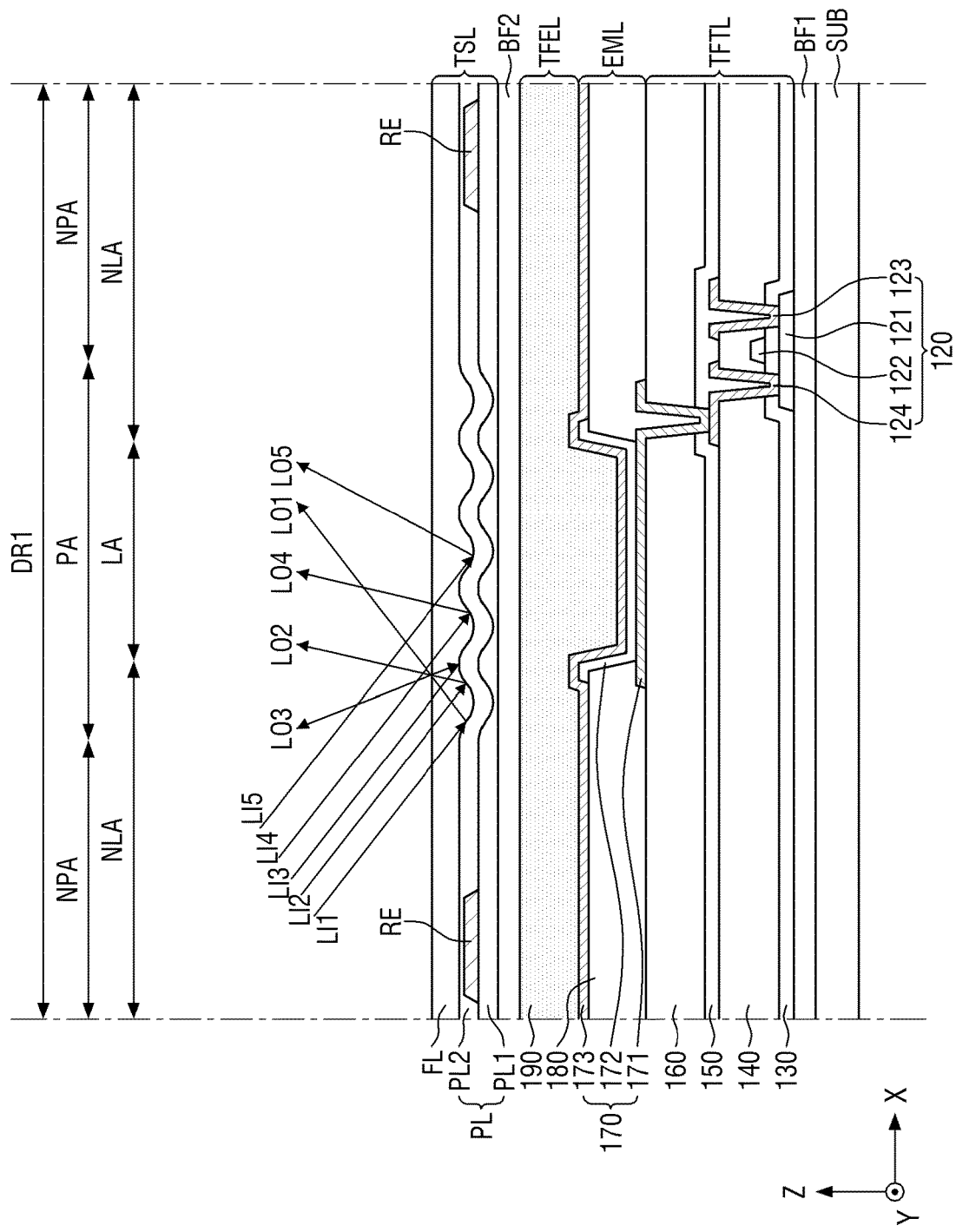
FIG. 11 is a cross-sectional view illustrating the path of reflected light of external light of FIG. 9.
Figure 12:
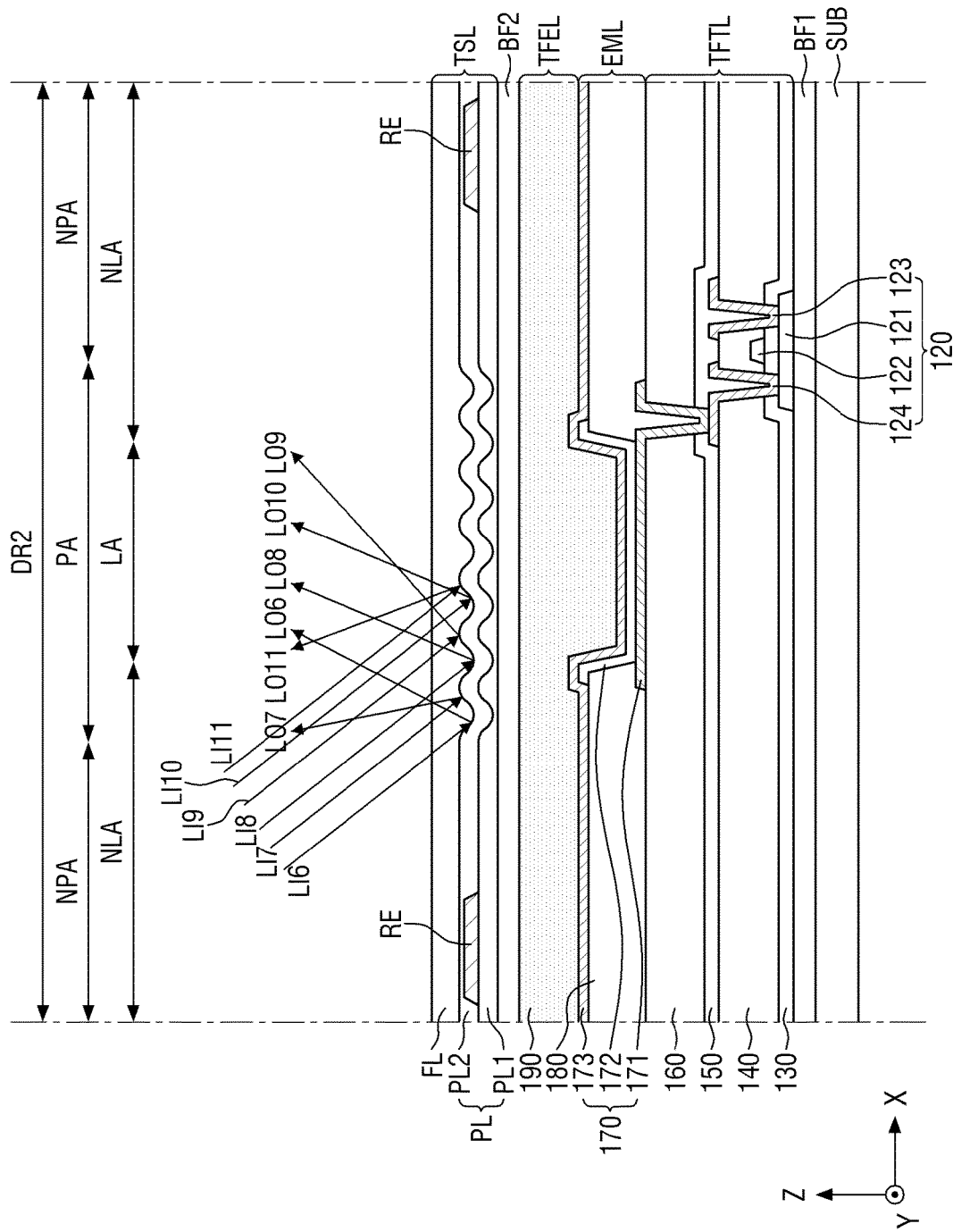
FIG. 12 is a cross-sectional view illustrating the path of reflected light of external light of FIG. 10.

FIG. 8 is an enlarged view illustrating an area B of FIG. 5; FIG. 9 is a cross-sectional view taken along line of FIG. 8; FIG. 10 is a cross-sectional view taken along line IV-IV' of FIG. 8; FIG. 11 is a cross-sectional view illustrating the path of reflected light of external light of FIG. 9; and FIG. 12 is a cross-sectional view illustrating the path of reflected light of external light of FIG. 10.

Referring to FIG. 8, the touch sensor layer TSL may be disposed on the display unit DU, and the driving electrodes TE of the touch sensor layer TSL may have a mesh shape surrounding the light-emitting areas LA. For example, the driving electrodes TE may not overlap with the light-emitting areas LA and may be formed into a mesh shape to be disposed between the light-emitting areas LA. The sensing electrodes RE may be formed substantially in the same manner as the driving electrodes TE, and thus, a detailed description thereof will be omitted.

The high refractive index layer PL of the touch sensor layer TSL includes the pattern areas PA and the non-pattern areas NPA. The pattern areas PA may overlap with the light-emitting areas LA in the thickness direction, but not with the sensing electrodes RE and the driving electrodes TE, but the inventive concepts are not limited thereto. In some exemplary embodiments, the pattern areas PA may overlap with the light-emitting areas LA, some of the sensing electrodes RE, and some of the driving electrodes TE in the thickness direction.

In the pattern areas PA, the first pattern parts PT1 and the second pattern parts PT2 may be disposed. For example, the first pattern parts PT1 may be disposed in pattern areas PA disposed in the first region DR1, which is flat, and the second pattern parts PT2 may be disposed in pattern areas PA disposed in the second regions DR2, which are curved.

The first pattern parts PT1 and the second pattern parts PT2 may overlap with the light-emitting areas LA in the third direction, i.e., in the thickness direction (or the Z-axis direction). For example, the first pattern parts PT1 may be disposed to overlap with light-emitting areas LA disposed in the first region DR1, which is flat, and the second pattern parts PT2 may be disposed to overlap with light-emitting areas LA disposed in the second regions DR2, which are curved.

The pattern areas PA may have a larger size than the light-emitting areas LA. For example, the pattern areas PA may overlap with the light-emitting areas LA in the thickness direction, may have a larger size than the light-emitting areas LA, and may completely cover the light-emitting areas LA, but the inventive concepts are not limited thereto. In some exemplary embodiments, the pattern areas PA may overlap with the light-emitting areas LA in the thickness direction and may have the same size as the light-emitting areas LA. In some exemplary embodiments, the pattern areas PA may overlap with the light-emitting areas LA in the thickness direction, may have a smaller size than the light-emitting areas LA, and may partially cover the light-emitting areas LA.

The pattern of arrangement of the first pattern parts PT1 disposed in the pattern areas PA disposed in the first region DR1 may be different from the pattern of arrangement of the second pattern parts PT2 in the pattern areas PA disposed in the second regions DR2. For example, the second pattern parts PT2 disposed in the pattern areas PA disposed in the second regions DR2, which are curved, may be more densely arranged than the first pattern parts PT1 disposed in the pattern areas PA disposed in the first region DR1, which is flat.

The numbers of protrusions PP and depressions DP of each of the first pattern parts PT1 may be greater than the numbers of protrusions PP and depressions DP of each of the second pattern parts PT2, but the inventive concepts are not limited thereto. In some exemplary embodiments, the numbers of protrusions PP and depressions DP of each of the first pattern parts PT1 may be the same as the numbers of protrusions PP and depressions DP of each of the second pattern parts PT2. In some exemplary embodiments, the numbers of protrusions PP and depressions DP of each of the first pattern parts PT1 may be smaller than the numbers of protrusions PP and depressions DP of each of the second pattern parts PT2.

In a plan view, the depressions DP of each of the first pattern parts PT1 may have a different area from the depressions DP of each of the second pattern parts PT2. For example, the depressions DP of each of the first pattern parts PT1 may have a larger area than the depressions DP of each of the second pattern parts PT2, but the inventive concepts are not limited thereto. In some exemplary embodiments, the depressions DP of each of the first pattern parts PT1 may have the same area as the depressions DP of each of the second pattern parts PT2. In some exemplary embodiments, the depressions DP of each of the first pattern parts PT1 may have a smaller area than the depressions DP of each of the second pattern parts PT2.

In some exemplary embodiments, the depressions DP of each of the first pattern parts PT1 and the depressions DP of each of the second pattern parts PT2 may have a circular shape in a plan view, but the inventive concepts are not limited thereto. Alternatively, the depressions DP of each of the first pattern parts PT1 and the depressions DP of each of the second pattern parts PT2 may have various other shapes such as a polygonal shape or an elliptical shape. In some exemplary embodiments, the depressions DP of each of the first pattern parts PT1 may have a different shape from the depressions DP of each of the second pattern parts PT2 in a plan view.

Referring to FIG. 9, in the first region DR1, which is flat, the display unit DU may include light-emitting areas LA and non-light-emitting areas NLA. As described above, the light-emitting areas LA are regions that release light generated by the light-emitting element layer EML of the display unit DU, and the non-light-emitting areas NLA are regions other than the light-emitting areas LA. The structure of the display unit DU has already been described above with reference to FIG. 7, and thus, a detailed description thereof will be omitted.

In the first region DR1, which is flat, the touch sensor layer TSL may include pattern areas PA and non-pattern areas NPA. The pattern areas PA are regions where the first pattern parts PT1 including the first and second concavo-convex portions PPA and PPB are disposed to diffuse reflected light, and the non-pattern areas NPA are regions where the first flat parts FT1 including the first non-concavo-convex portions FP1 and the second non-concavo-convex portions FP2 are disposed.

In some exemplary embodiments, the light-emitting areas LA may overlap with the pattern areas PA in the thickness direction, i.e., in the third direction (or the Z-axis direction). Also, the length, in the first direction (or the X-axis direction), of the pattern areas PA may be greater than the length, in the first direction (or the X-axis direction), of the light-emitting areas LA. For example, the pattern areas PA may overlap with the light-emitting areas LA in the thickness direction, i.e., in the third direction (or the Z-axis direction), and may completely cover the light-emitting areas LA.

In some exemplary embodiments, the first depressions DP1 of the first concavo-convex portion PPA may overlap with the second depressions DP2 of the second concavo-convex portion PPB in the thickness direction, i.e., in the third direction (or the Z-axis direction), and the first protrusions PP1 of the first concavo-convex portion PPA may overlap with the second protrusions PP2 of the second concavo-convex portion PPB in the thickness direction, i.e., in the third direction (or the Z-axis direction). However, the inventive concepts are not limited to this. In some exemplary embodiments, the first depressions DP1 of the first concavo-convex portion PPA may overlap with the second protrusions PP2 of the second concavo-convex portion PPB in the thickness direction, i.e., in the third direction (or the Z-axis direction), and the first protrusions PP1 of the first concavo-convex portion PPA may overlap with the second depressions DP2 of the second concavo-convex portion PPB in the thickness direction, i.e., in the third direction (or the Z-axis direction).

Referring to FIG. 10, in the second regions DR2, which are curved, the display unit DU may include light-emitting areas LA and non-light-emitting areas NLA, and the touch sensor layer TSL may include pattern areas PA and non-pattern areas NPA. The pattern areas PA are regions where the second pattern parts PT2 including the first and second concavo-convex portions PPA and PPB are disposed to diffuse reflected light, and the non-pattern areas NPA are regions where the second flat parts FT2 including the first non-concavo-convex portions FP1 and the second non-concavo-convex portions FP2 are disposed.

Referring to FIGS. 9 and 10, a first pitch T1 of the second concavo-convex portion PPB of each of the first pattern parts PT1 may be greater than a second pitch T2 of the second concavo-convex portion PPB of each of the second pattern parts PT2. The first pitch Ti may refer to the distance between the centers of a pair of adjacent second depressions DP2 of each of the first pattern parts PT1, and the second pitch T2 may refer to the distance between the centers of a pair of adjacent second depressions DP2 of each of the second pattern parts PT2. By arranging the second concavo-convex portion PPB of each of the first pattern parts PT1 and the concavo-convex portion PPB of each of the second pattern parts PT2 such that the first pitch Ti can be greater than the second pitch T2, the visibility of reflected light can be further reduced by increasing the diffusion of light in the second regions DR2 where reflected light of external light more visible than in the first region DR1. Accordingly, visibility degradation caused by reflected light can be prevented, and white angle dependency (WAD) for viewing angle can be improved.

Referring to FIG. 11, first, second, third, fourth, and fifth external light LI1, LI2, LI3, LI4, and LI5 incident upon the first region DR1 is reflected over the top of the first region DR1 due to the difference in refractive index between the planarization layer FL and the high refractive index layer PL. Since the first pattern parts PT1 are provided in the high refractive index layer PL to correspond to the light-emitting areas LA, the first, second, third, fourth, and fifth external light LI1, LI2, LI3, LI4, and LI5 is output as first, second, third, fourth, and fifth reflected light LO1, LO2, LO3, LO4, and LO5, respectively, having different reflection angles due to the presence of the second depressions DP2 and the second protrusions PP2 of each of the first pattern parts PT1. FIG. 11 illustrates that the first, second, third, fourth, and fifth external light LI1, LI2, LI3, LI4, and LI5 is reflected at the interface between the planarization layer FL and the second high refractive index layer PL2, but the inventive concepts are not limited thereto. In some exemplary embodiments, some of the first, second, third, fourth, and fifth external light LI1, LI2, LI3, LI4, and LI5 may be reflected at the interface between the second high refractive index layer PL2 and the first high refractive index layer PL1. For example, some of the first, second, third, fourth, and fifth external light LI1, LI2, LI3, LI4, and LI5 may be diffused by the first depressions DP1 and the first protrusions PP1 of the first high refractive index layer PL1. Also, in some exemplary embodiments, some of the first, second, third, fourth, and fifth external light LI1, LI2, LI3, LI4, and LI5 may be reflected at the interface between the first high refractive index layer PL1 and the second buffer layer BF2.

Referring to FIG. 12, sixth, seventh, eighth, ninth, tenth, and eleventh external light LI6, LI7, LI8, LI9, LI10, and LI11 incident upon the second regions DR2 is reflected over the tops of the second regions DR2 due to the difference in refractive index between the planarization layer FL and the high refractive index layer PL. Since the second pattern parts PT2 are provided in the high refractive index layer PL to correspond to the light-emitting areas LA, the sixth, seventh, eighth, ninth, tenth, and eleventh external light LI6, LI7, LI8, LI9, LI10, and LI11 is output as sixth, seventh, eighth, ninth, tenth, and eleventh reflected light LO6, LO7, LO8, LO9, LO10, and LO11, respectively, having different reflection angles due to the presence of the second depressions DP2 and the second protrusions PP2 of each of the second pattern parts PT2. FIG. 12 illustrates that the sixth, seventh, eighth, ninth, tenth, and eleventh external light LI6, LI7, LI8, LI9, LI10, and LI11 is reflected at the interface between the planarization layer FL and the second high refractive index layer PL2, but the inventive concepts are not limited thereto. In some exemplary embodiments, some of the sixth, seventh, eighth, ninth, tenth, and eleventh external light LI6, LI7, LI8, LI9, LI10, and LI11 may be reflected at the interface between the second high refractive index layer PL2 and the first high refractive index layer PL1. For example, some of the sixth, seventh, eighth, ninth, tenth, and eleventh external light LI6, LI7, LI8, LI9, LI10, and LI11 may be diffused by the first depressions DP1 and the first protrusions PP1 of the first high refractive index layer PL1. Also, in some exemplary embodiments, some of the sixth, seventh, eighth, ninth, tenth, and eleventh external light LI6, LI7, LI8, LI9, LI10, and LI11 may be reflected at the interface between the first high refractive index layer PL1 and the second buffer layer BF2.

Since the high refractive index layer PL, which has a smaller refractive index than the second buffer layer BF2 and a greater refractive index than the planarization layer FL and includes the first pattern parts PT1 and the second pattern parts PT2, is disposed between the second buffer layer BF2 and the planarization layer FP to prevent visibility degradation caused by reflected light, the display quality of the display device 10 can be improved. Also, since the second pattern parts PT2 in the pattern areas PA disposed in the second regions DR2, which are curved, are arranged more densely than the first pattern parts PT1 in the pattern areas PA disposed in the first region DR1, which is flat, the diffusion of light in the second regions DR2 where reflected light of external light is more visible than in the first region DR1, can be increased, and as a result, the visibility of reflected light can be further reduced. Accordingly, WAD for viewing angle can be improved.

Figure 13:
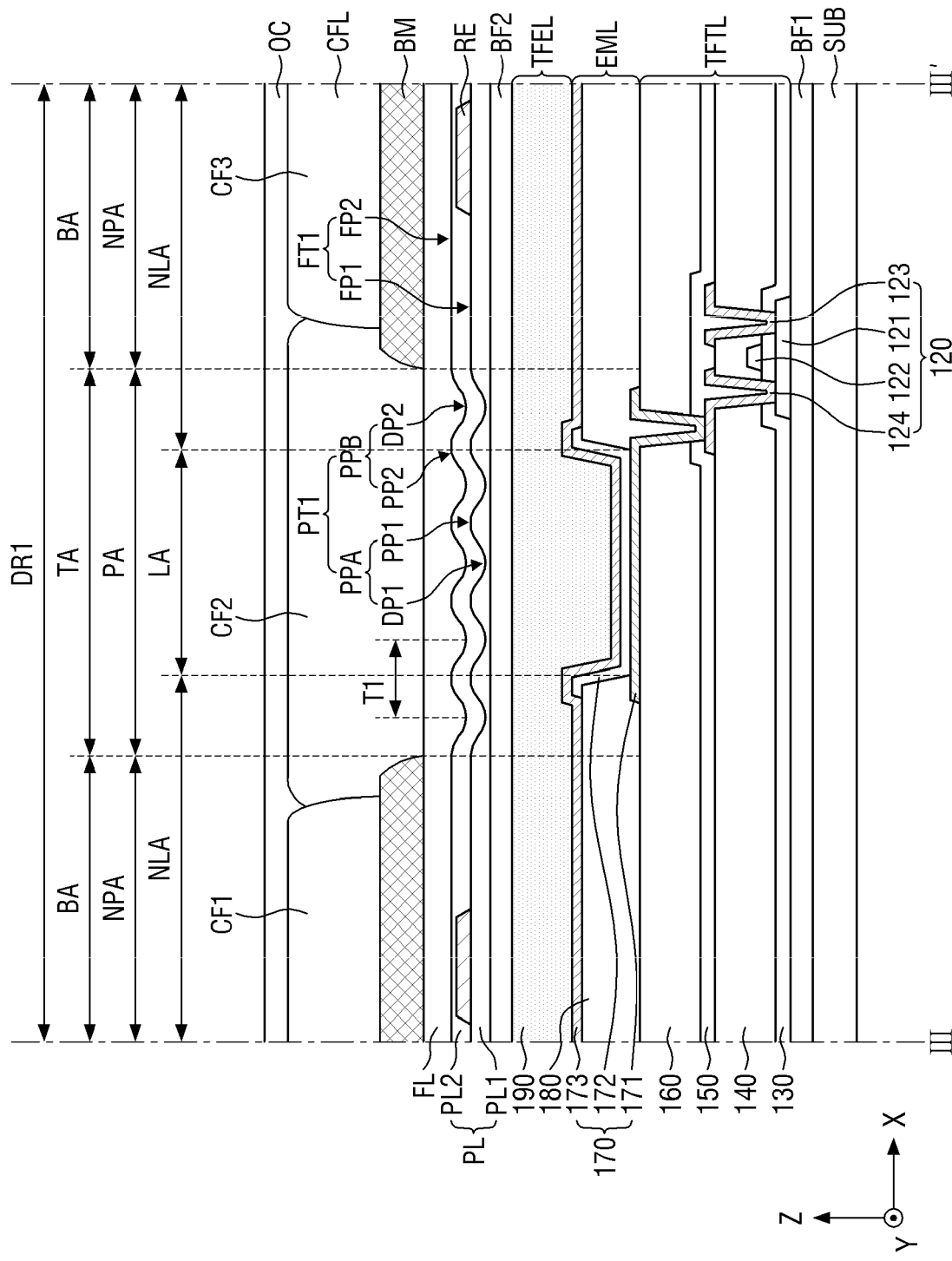
FIG. 13 is a cross-sectional view, taken along line of FIG. 8, of a display device according to another exemplary embodiment of the present invention.
Figure 14:
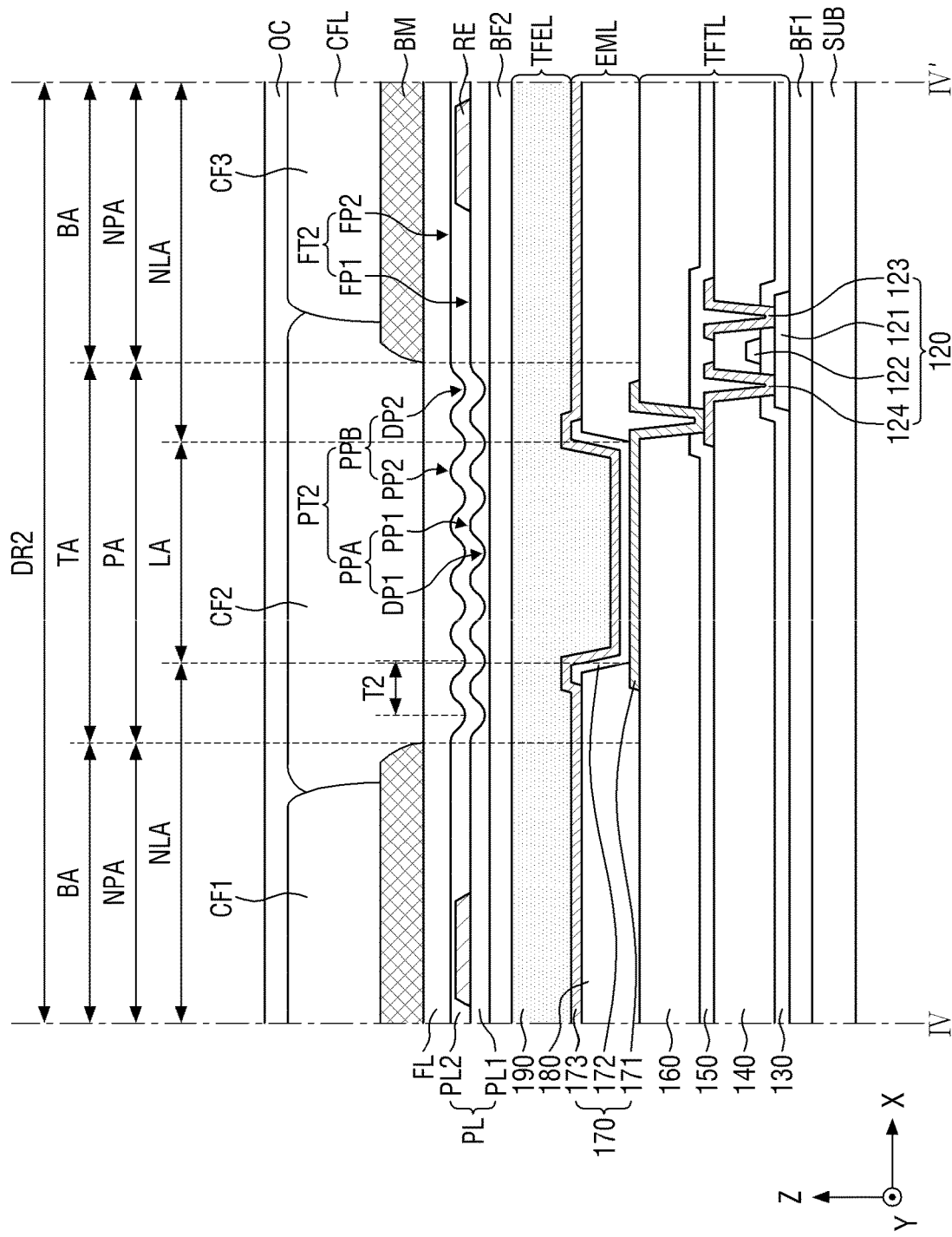
FIG. 14 is a cross-sectional view, taken along line IV-IV' of FIG. 8, of a display device according to another exemplary embodiment of the present invention.

FIG. 13 is a cross-sectional view, taken along line of FIG. 8, of a display device according to another exemplary embodiment of the present invention, and FIG. 14 is a cross-sectional view, taken along line IV-IV' of FIG. 8, of a display device according to another exemplary embodiment of the present invention. The exemplary embodiments of FIGS. 13 and 14 differ from the exemplary embodiment of FIGS. 9 and 10 in that a color filter layer is disposed above a planarization layer. The exemplary embodiments of FIGS. 13 and 14 will hereinafter be described, focusing mainly on the difference(s) with the embodiment of FIGS. 9 and 10.

Referring to FIGS. 13 and 14, a color filter layer CFL may be disposed above a planarization layer FL. The color filter layer CFL may include first color patterns CF1, second color patterns CF2, and third color patterns CF3, but the inventive concepts are not limited thereto. In some exemplary embodiments, the color filter layer CFL may include the first color patterns CF1 and the second color patterns CF2 or may include other additional color patterns in addition to the first color patterns CF1, the second color patterns CF2, and the third color patterns CF3.

A light-shielding member BM may be disposed between the color filter layer CFL and the planarization layer FL. For example, a first region DR1 and second regions DR2 may each include light-shielding areas BA and light-transmitting areas TA, and the light-shielding member BM may be disposed between the color filter layer CFL and the planarization layer FL to correspond to the light-shielding areas BA. The light-transmitting areas TA may be regions that release light emitted from a display unit DU out of a display device 10. The light-shielding areas BA may be regions that do not transmit light emitted from the display unit DU therethrough.

The light-shielding member BM may be disposed along the edges of each of the light-transmitting areas TA and may include openings that expose the light-transmitting areas TA. The light-shielding member BM may have a lattice shape having parts connected to one another along the edges of each of the light-transmitting areas TA. Light-emitting areas LA of the display unit DU may overlap with the openings of the light-shielding member BM in a thickness direction, i.e., in a third direction (or a Z-axis direction), and driving electrodes TE, sensing electrodes RE, and connecting electrodes BE may overlap with the light-shielding member BM in the thickness direction, i.e., in the third direction (or the Z-axis direction).

The light-shielding member BM may include a light-absorbing material or a light-reflecting material. For example, the light-shielding member BM may include a resin colored in black or a reflective metal such as Cr.

The first color patterns CF1, the second color patterns CF2, and the third color patterns CF3 may be disposed on the light-shielding member BM. The first color patterns CF1, the second color patterns CF2, and the third color patterns CF3 may be disposed above the openings of the light-shielding member BM and may extend even over to the surface of the light-shielding member BM to overlap with one another over the light-shielding member BM, but the inventive concepts are not limited thereto. In some exemplary embodiments, the first color patterns CF1, the second color patterns CF2, and the third color patterns CF3 may be disposed above the openings of the light-shielding member BM and may be spaced apart from one another, instead of overlapping with one another.

In some exemplary embodiments, the first color patterns CF1 may selectively transmit red light having a wavelength of about 620 nm to 750 nm therethrough, the second color patterns CF2 may selectively transmit green light having a wavelength of about 495 nm to 570 nm therethrough, and the third color patterns CF3 may selectively transmit blue light having a wavelength of about 450 nm to 495 nm therethrough.

The first color patterns CF1, the second color patterns CF2, and the third color patterns CF3 may be disposed to correspond to the light-transmitting areas TA. For example, the first color patterns CF1 may be disposed to correspond to light-transmitting areas TA outputting red light, the second color patterns CF2 may be disposed to correspond to light-transmitting areas TA outputting green light, and the third color patterns CF3 may be disposed to correspond to light-transmitting areas TA outputting blue light.

An overcoat layer OC may be disposed on the color filter layer CFL. The overcoat layer OC planarizes a height difference generated by the color filter layer CFL and protects the color filter layer CFL. The overcoat layer OC may be formed as an organic film using an acrylic resin, an epoxy resin, a phenolic resin, a polyamide resin, or a polyimide resin, but the inventive concepts are not limited thereto.

The color filter layer CFL can prevent light output by the light-emitting areas LA from being mixed and can improve color reproducibility. Also, since the color filter layer CFL can absorb a considerable amount of external light, the reflection of external light can be reduced without a requirement of a polarization member, which is generally highly expensive.

Figure 15:
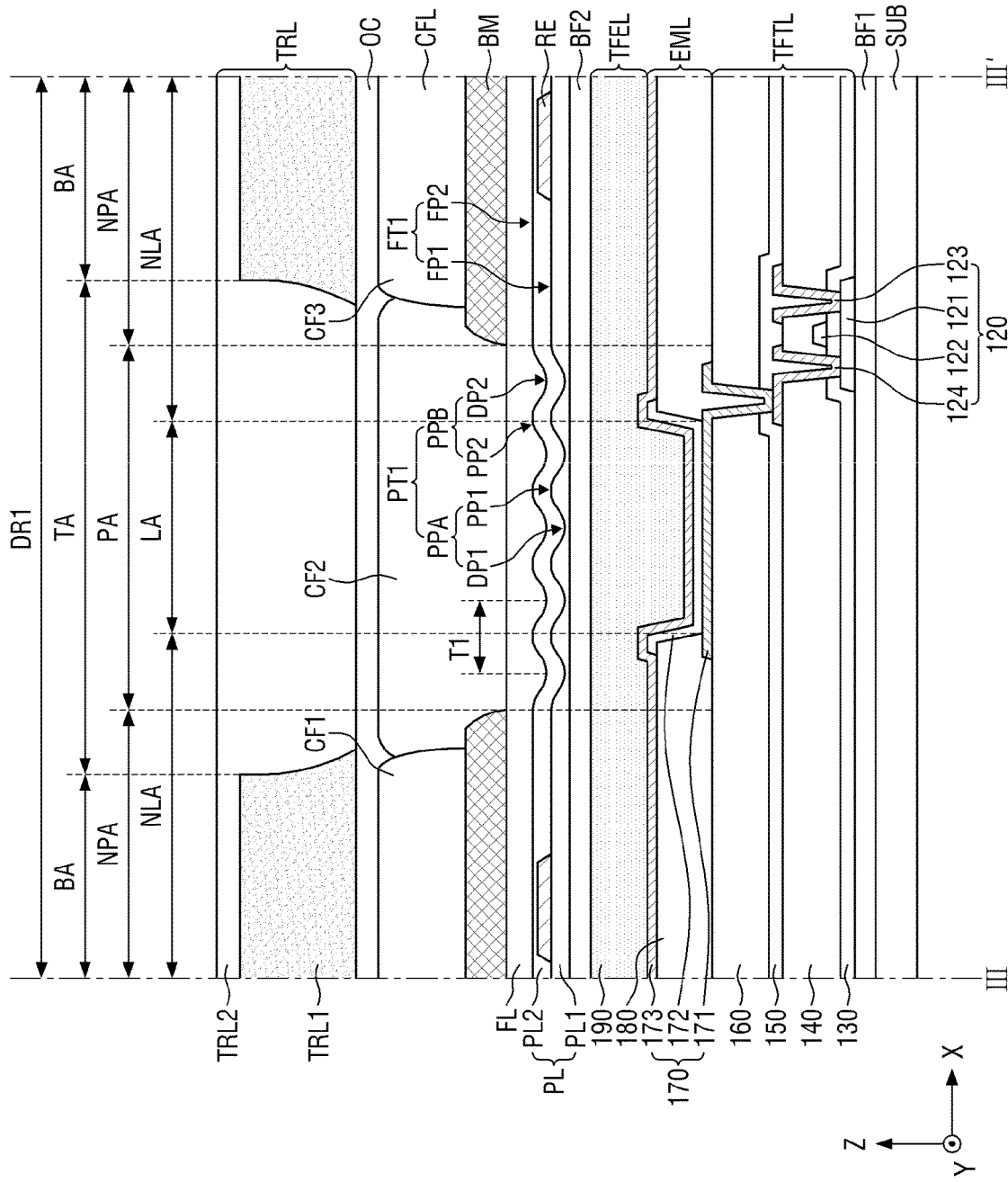
FIG. 15 is a cross-sectional view, taken along line of FIG. 8, of a display device according to another exemplary embodiment of the present invention.
Figure 16:
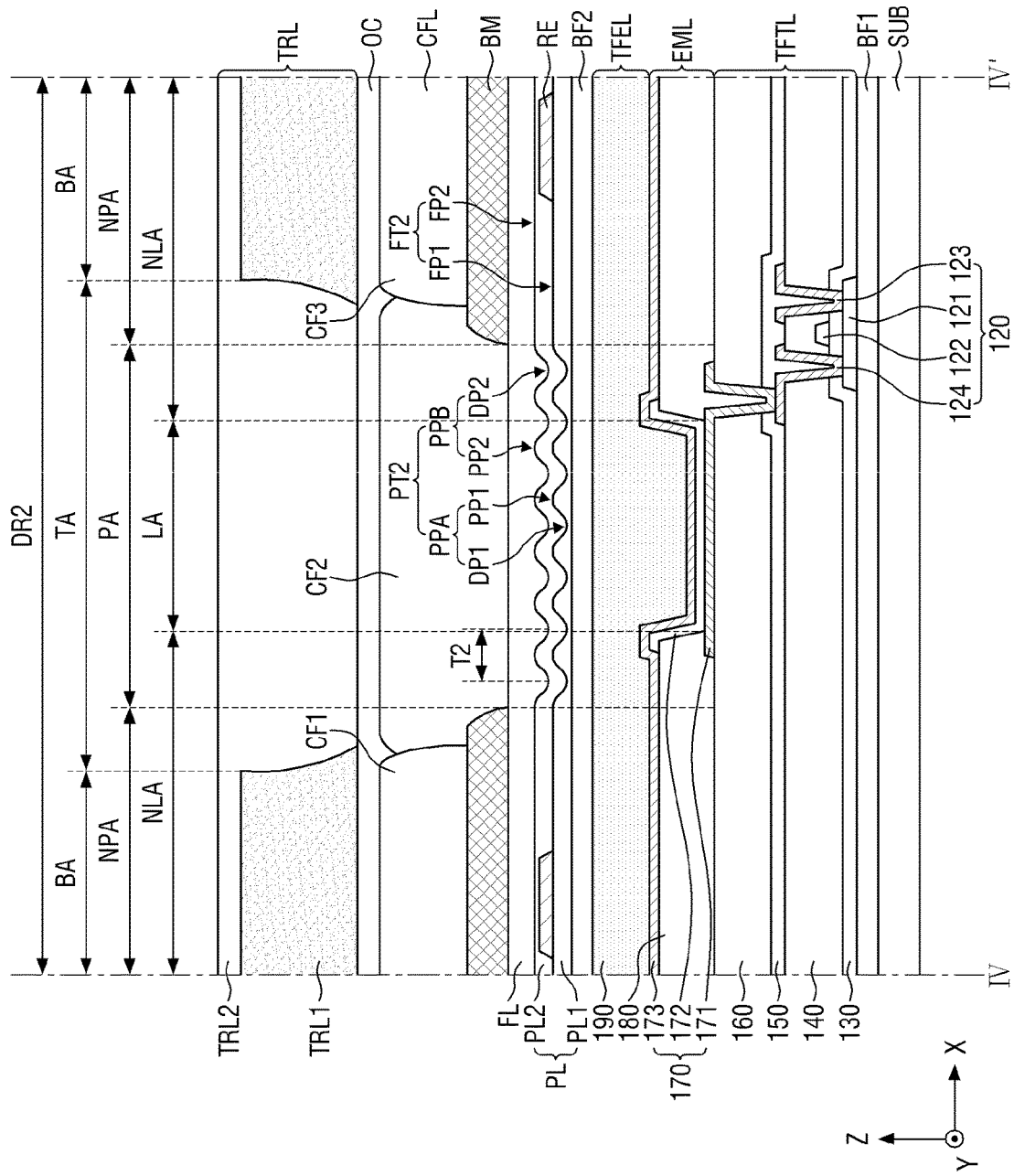
FIG. 16 is a cross-sectional view, taken along line IV-IV' of FIG. 8, of a display device according to another exemplary embodiment of the present invention.
Figure 17:
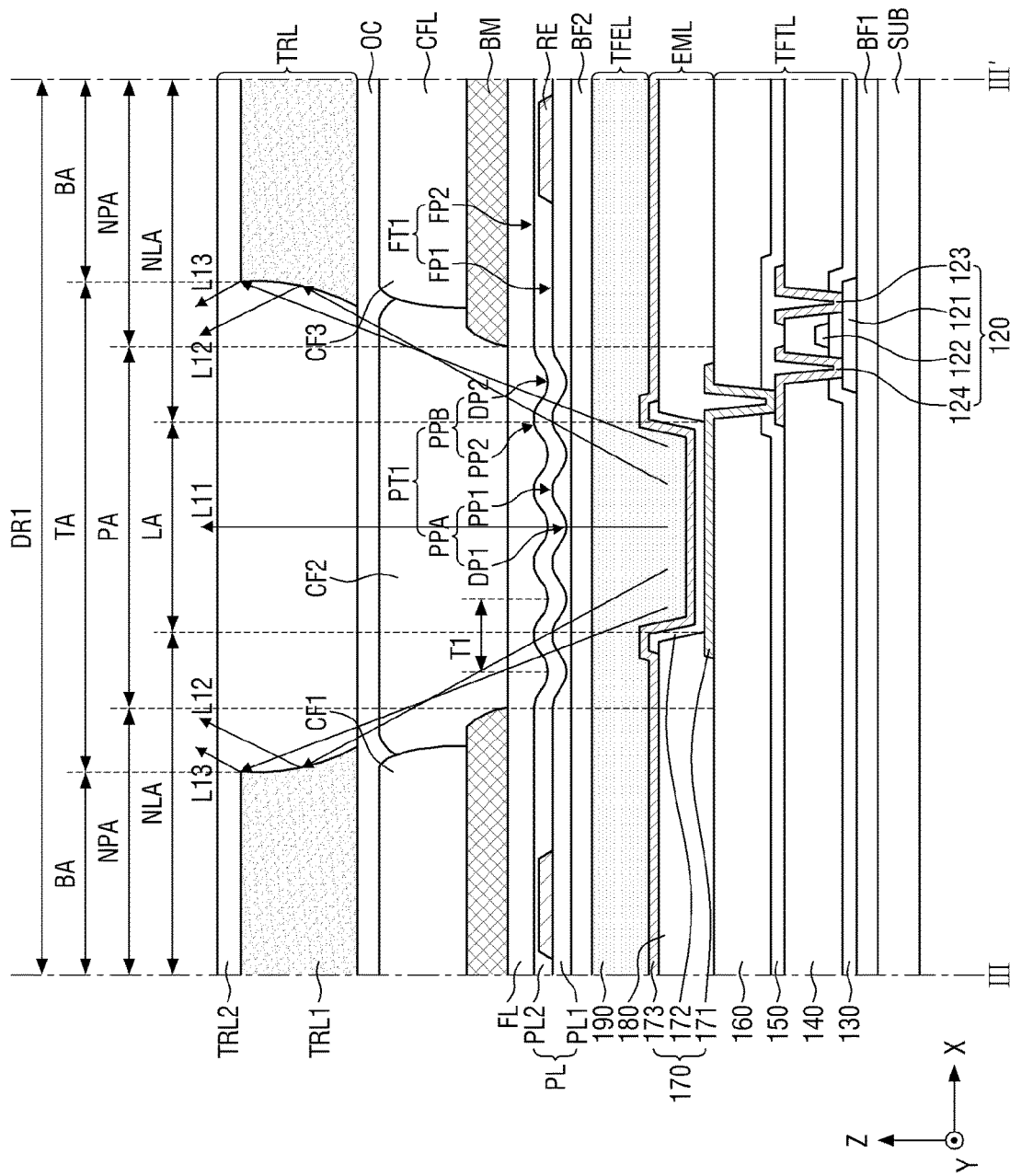
FIG. 17 is a cross-sectional view illustrating the path of light emitted from a display unit of FIG. 15.
Figure 18:
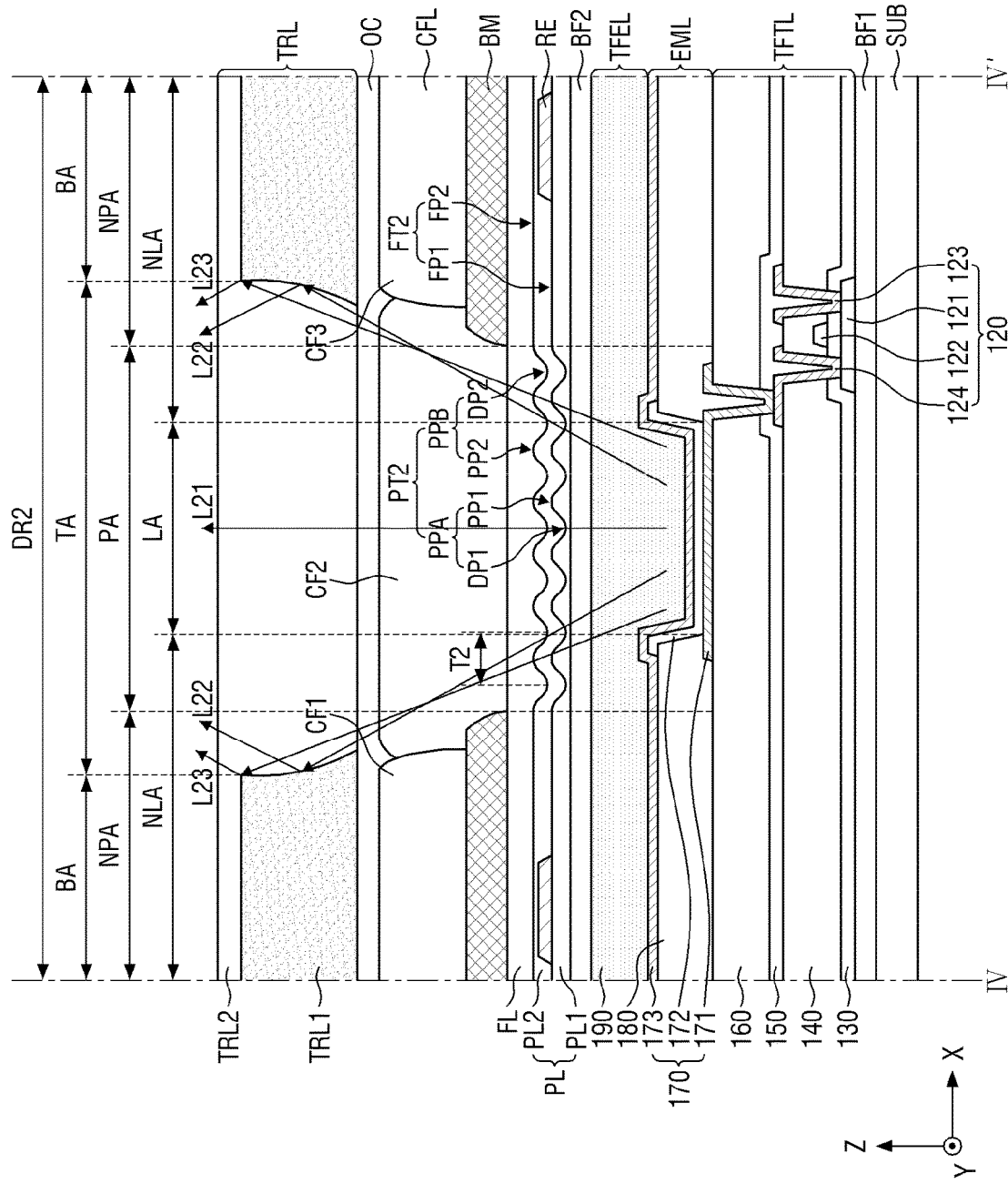
FIG. 18 is a cross-sectional view illustrating the path of light emitted from a display unit of FIG. 16.

FIG. 15 is a cross-sectional view, taken along line of FIG. 8, of a display device according to another exemplary embodiment of the present invention; FIG. 16 is a cross-sectional view, taken along line IV-IV' of FIG. 8, of a display device according to another exemplary embodiment of the present invention; FIG. 17 is a cross-sectional view illustrating the path of light emitted from a display unit of FIG. 15; and FIG. 18 is a cross-sectional view illustrating the path of light emitted from a display unit of FIG. 16. The exemplary embodiments of FIGS. 15 and 16 differ from the embodiments of FIGS. 13 and 14 in that a light path changing layer is disposed above a color filter layer. The exemplary embodiments of FIGS. 15 and 16 will hereinafter be described, focusing mainly on the difference(s) with the exemplary embodiments of FIGS. 13 and 14.

Referring to FIGS. 15 and 16, a light path changing layer TRL is disposed on a color filter layer CFL. The light path changing layer TRL is a layer changing the path of light traveling in directions other than in an upward direction (or a Z-axis direction), among beams of light emitted from a light-emitting element layer EML of a display unit DU, so as for the light to be emitted in the upward direction (or the Z-axis direction). The light path changing layer TRL may include first and second light path changing layers TRL1 and TRL2.

The first light path changing layer TRL1 may be disposed on an overcoat layer OC. The first light path changing layer TRL1 overlaps with the light-shielding member BM in a thickness direction (or the Z-axis direction), but does not overlap with light-emitting areas LA and pattern areas PA in the thickness direction (or the Z-axis direction), but the inventive concepts are not limited thereto. Alternatively, the first light path changing layer TRL1 may partially overlap with the pattern areas PA in the thickness direction (or the Z-axis direction) or may partially overlap with both the light-emitting areas and the pattern areas PA in the thickness direction (or the Z-axis direction).

The first light path changing layer TRL1 may include a bottom surface that is in contact with the overcoat layer OC, a top surface that is opposite to the bottom surface, and inclined surfaces that connect the bottom surface and the top surface. The top surface of the first light path changing layer TRL1 may have a smaller area than the bottom surface of the first light path changing layer TRL1.

The first light path changing layer TRL1 may be formed as an organic film or as an organic film including inorganic particles. The organic film may be formed of an acrylic resin, an epoxy resin, a phenolic resin, a polyamide resin, or a polyimide resin, but the inventive concepts are not limited thereto. The inorganic particles may be metal particles, but the inventive concepts are not limited thereto.

The second light path changing layer TRL2 may be formed on the overcoat layer OC and on the first light path changing layer TRL1. The second light path changing layer TRL2 planarizes a height difference generated by the first light path changing layer TRL1. To this end, the second light path changing layer TRL2 may be formed to be thicker than the first light path changing layer TRL1.

The second light path changing layer TRL2 may be formed as an organic film or as an organic film including inorganic particles. The organic film may be formed of an acrylic resin, an epoxy resin, a phenolic resin, a polyamide resin, or a polyimide resin, but the inventive concepts are not limited thereto. The inorganic particles may be metal particles, but the inventive concepts are not limited thereto.

The refractive index of the second light path changing layer TRL2 may be greater than the refractive index of the first light path changing layer TRL1 in order for light emitted from the light-emitting element layer EML of the display unit DU to be reflected by the inclined surfaces of the first light path changing layer TRL1 and to travel in the upward direction (or the Z-axis direction).

Referring to FIGS. 17 and 18, first light (L11 and L21) output vertically from the light-emitting element layer EML of the display unit DU may penetrate a touch sensor layer TSL, a color filter layer CFL, and the second light path changing layer TRL2 and may then be output vertically from the second light path changing layer TRL2, the path of second light (L12 and L22) output from the light-emitting element layer EML of the display unit DU at a predetermined angle in a lateral direction may be changed at the interface between the first and second light path changing layers TRL1 and TRL2 such that the second light (L12 and L22) can be output to light-emitting areas TA, and the path of third light (L13 and L33) output from the light-emitting element layer EML of the display unit DU at a predetermined angle in a lateral direction may be changed at the interface between the first and second light path changing layers TRL1 and TRL2 such that the third light (L13 and L33) can be output to the light-emitting areas TA. In other words, the light path changing layer TRL can improve emission efficiency by changing the path of light traveling in a lateral direction, among beams of light emitted from the light-emitting element layer EML of the display unit DU, so as for the light to be emitted in the upward direction (or the Z-axis direction). Accordingly, the life of light-emitting elements 170 can be increased, and the power consumption of a display device 10 can be reduced.

Figure 19:
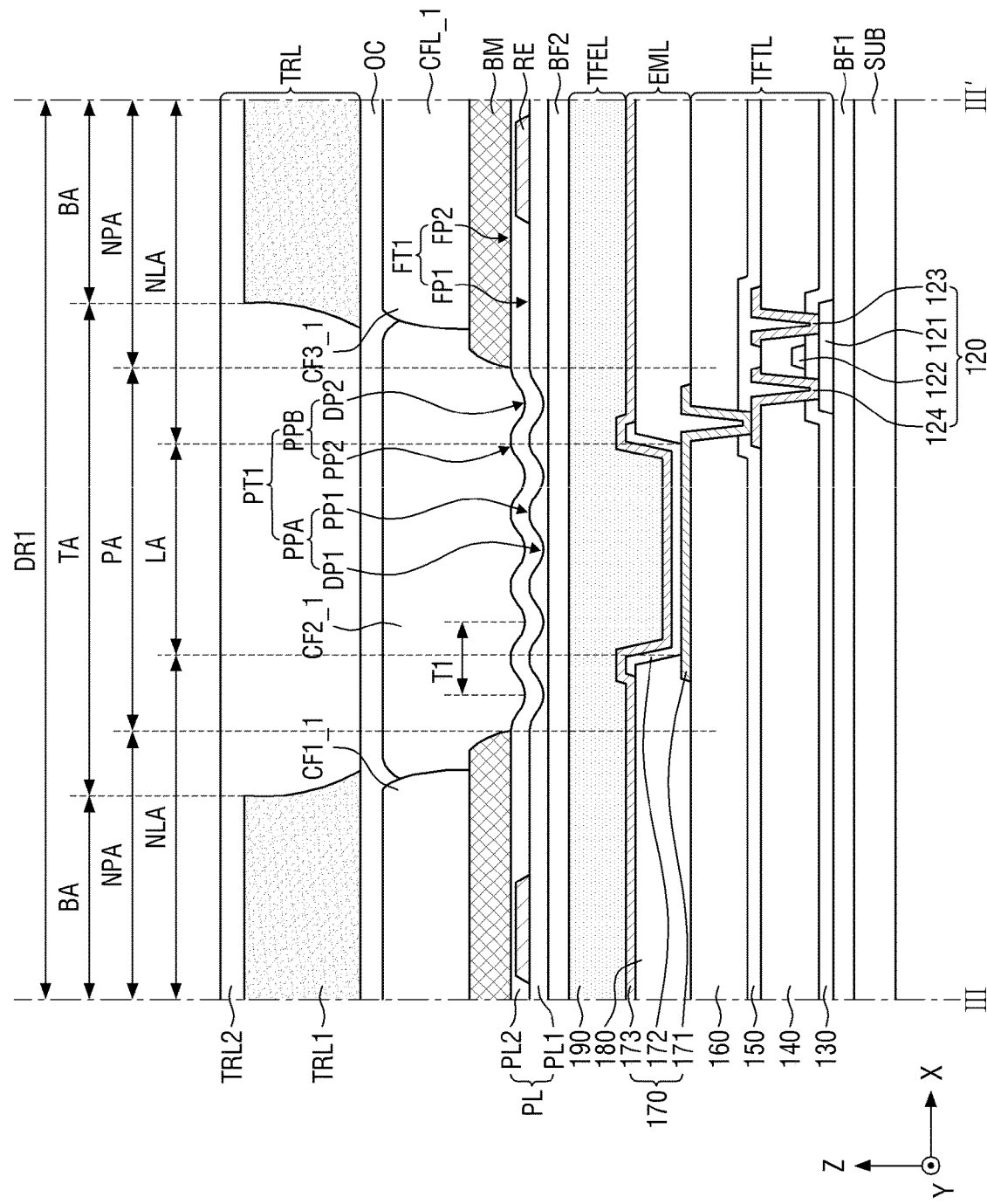
FIG. 19 is a cross-sectional view, taken along line of FIG. 8, of a display device according to another exemplary embodiment of the present invention.
Figure 20:
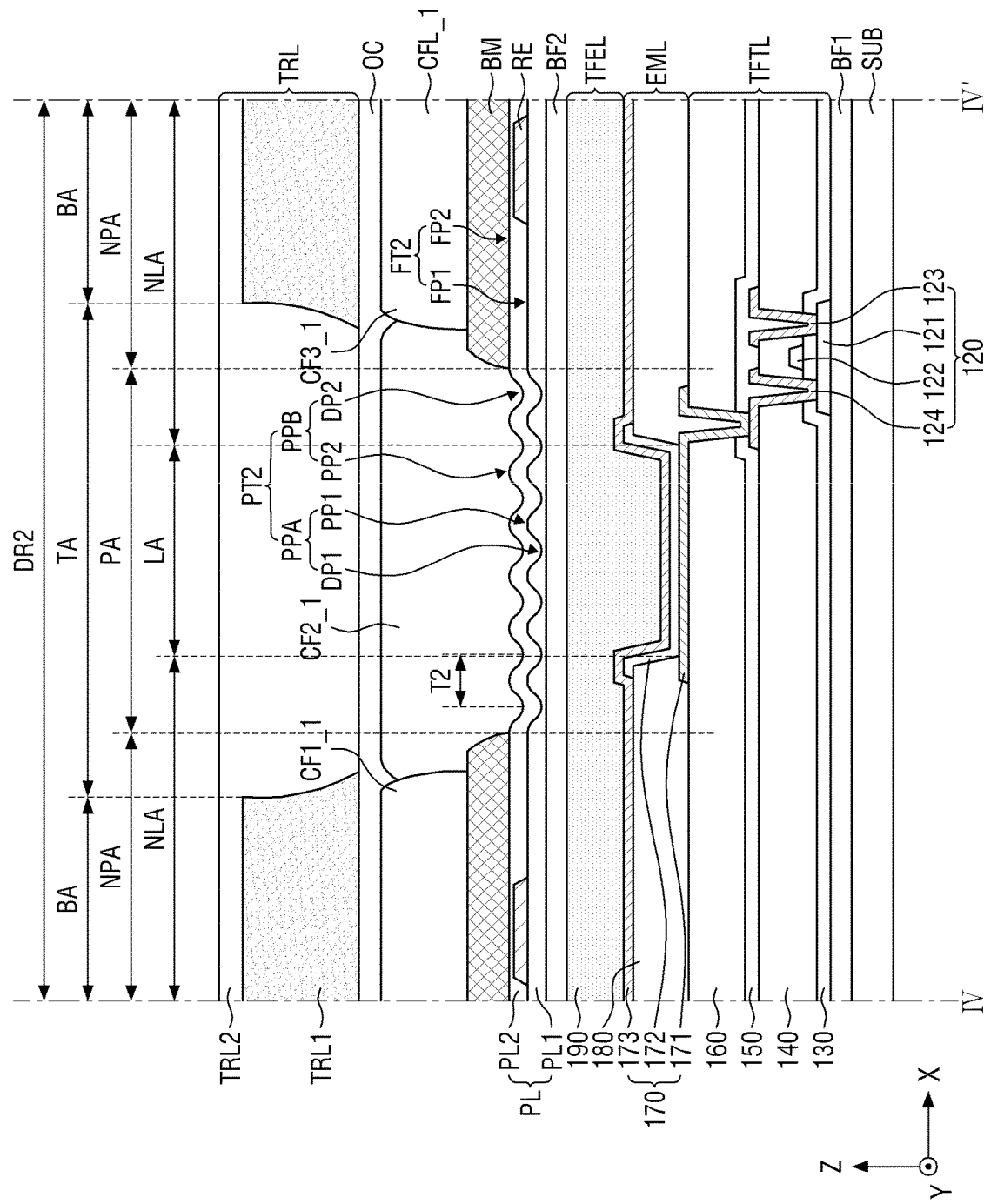
FIG. 20 is a cross-sectional view, taken along line IV-IV' of FIG. 8, of a display device according to another exemplary embodiment of the present invention.

FIG. 19 is a cross-sectional view, taken along line of FIG. 8, of a display device according to another exemplary embodiment of the present invention; and FIG. 20 is a cross-sectional view, taken along line IV-IV' of FIG. 8, of a display device according to another exemplary embodiment of the present invention. The exemplary embodiments of FIGS. 19 and 20 differ from the exemplary embodiments of FIGS. 15 and 16 in that a planarization layer is not provided in a touch sensor layer. The exemplary embodiments of FIGS. 19 and 20 will hereinafter be described, focusing mainly on the difference(s) from the exemplary embodiments of FIGS. 15 and 16.

Referring to FIGS. 19 and 20, a light-shielding member BM and a color filter layer CFL_1 may be disposed above a high refractive index layer PL. The color filter layer CFL_1 may be in contact with the high refractive index layer PL in pattern areas PA of the high refractive index layer PL, and the light-shielding member BM may be in contact with the high refractive index layer PL in non-pattern areas NPA of the high refractive index layer PL. However, the inventive concepts are not limited to this. The color filter layer CFL_1 may be in contact with the high refractive index layer PL in the pattern areas PA and in some of the non-pattern areas NPA, and the light-shielding member BM may be in contact with the high refractive index layer PL in the non-pattern areas NPA and in some of the pattern areas PA.

The color filter layer CFL_1 may be in contact with pattern parts (PT1 and PT2) of the high refractive index layer PL. For example, second color patterns CF2_1 of the color filter layer CFL_1 may be disposed to be in contact with the top surfaces of second depressions DP2 and second protrusions PP2 of the high refractive index layer PL. The bottom surfaces of the second color patterns CF2_1 may be formed along the morphologies of the second depressions DP2 and the second protrusions PP2. FIGS. 19 and 20 illustrate that first color patterns CF1_1 and third color patterns CF3_1 are in contact only with the light-shielding member BM, but the inventive concepts are not limited thereto. That is, the first color patterns CF1_1 and the third color patterns CF3_1, like the second color patterns CF2_1, may be in contact with the top surfaces of the second depressions DP2 and the second protrusions PP2 in areas that overlap with the pattern parts (PT1 and PT2) of the high refractive index layer PL, and the bottom surfaces of the first color patterns CF1_1 and the third color patterns CF3_1 may also be formed along the morphologies of the second depressions DP2 and the second protrusions PP2. In a case where a planarization layer (FP of FIGS. 15 and 16) is not provided and the light-shielding member BM and the color filter layer CFL_1 is disposed above the high refractive index layer PL, a process of forming the planarization layer can be omitted. As a result, the manufacture of a display device 10 can be simplified, and a thin display device 10 can be realized.

Figure 21:
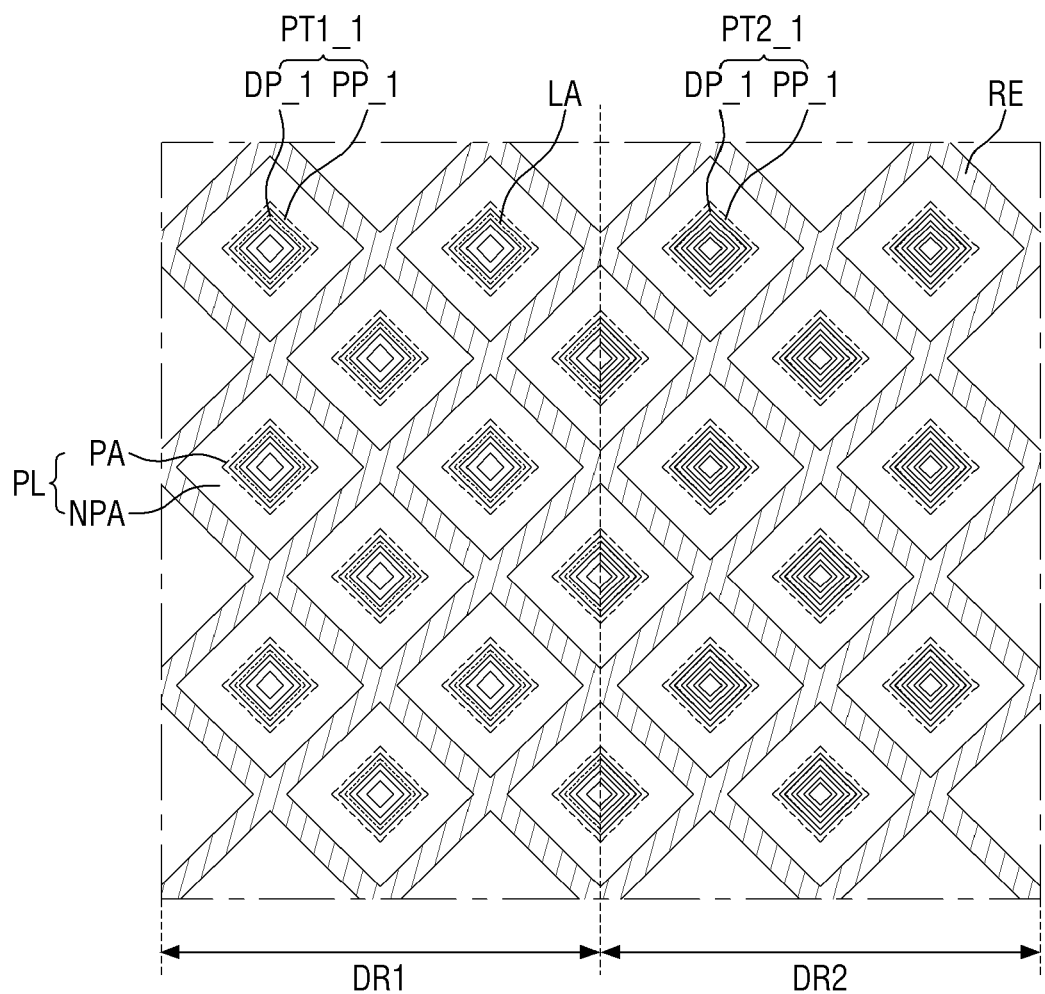
FIG. 21 is an enlarged view illustrating an area of a display device according to another exemplary embodiment of the present disclosure corresponding to the area B of FIG. 5.
Figure 22:
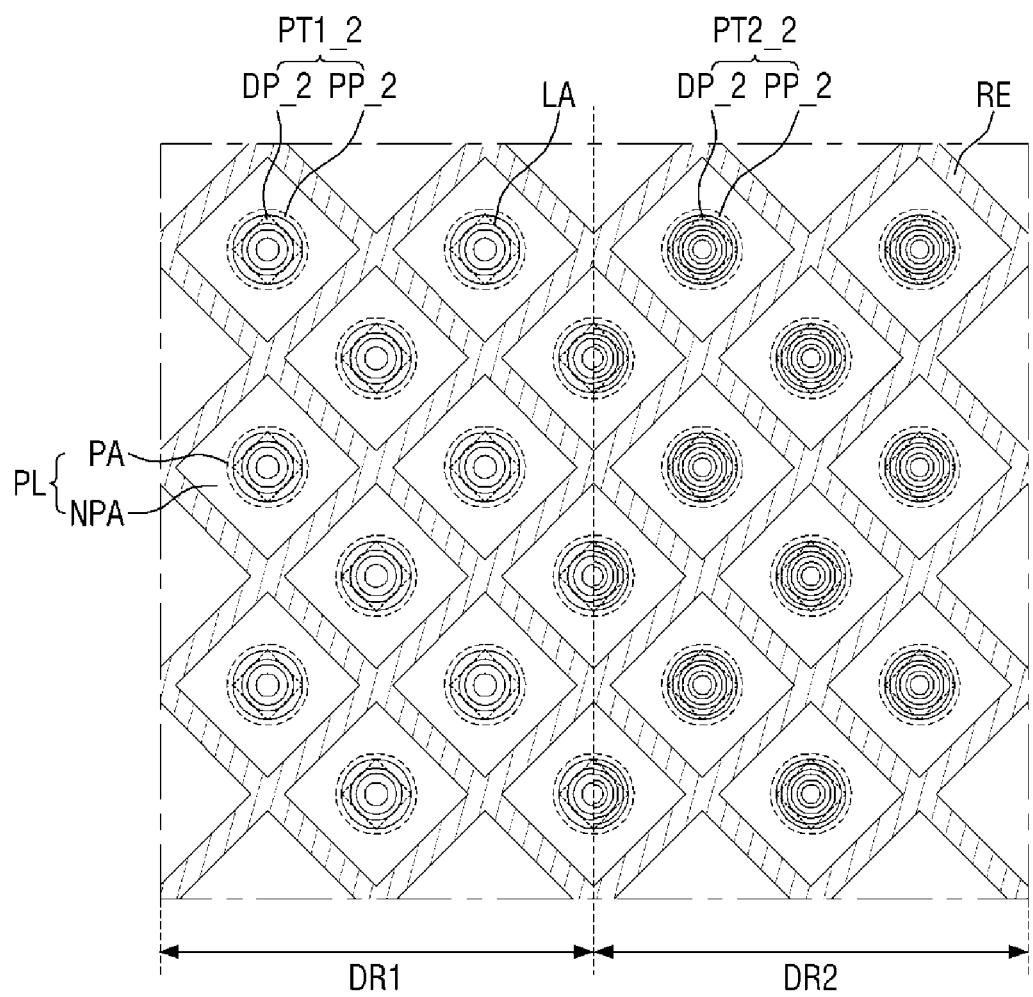
FIG. 22 is an enlarged view illustrating an area of a display device according to another exemplary embodiment of the present disclosure corresponding to the area B of FIG. 5.

FIG. 21 is an enlarged view illustrating an area of a display device according to another exemplary embodiment of the present invention corresponding to the area B of FIG. 5; and FIG. 22 is an enlarged view illustrating an area of a display device according to another exemplary embodiment of the present invention corresponding to the area B of FIG. 5. The exemplary embodiments of FIGS. 21 and 22 differ from the exemplary embodiment of FIG. 8 in the shapes of first pattern parts and second pattern parts of a high refractive index layer. The exemplary embodiments of FIGS. 21 and 22 will hereinafter be described, focusing mainly on the differences from the exemplary embodiment of FIG. 8.

Referring to FIG. 21, a high refractive index layer PL of a touch sensor layer TSL may include pattern areas PA and non-pattern areas NPA, and in the pattern areas PA, first pattern parts PT1_1 and second pattern parts PT2_1 may be disposed. For example, in pattern areas PA disposed in a first region DR1, which is flat, the first pattern parts PT1_1 may be disposed, and in pattern areas PA disposed in second regions DR2, which are curved, the second pattern parts PT2_1 may be disposed.

Each of the first pattern parts PT1_1 may include a plurality of depressions DP_1, which are formed as closed curves, and a plurality of protrusions PP_1, which are formed as closed curves, and each of the second pattern parts PT2_1 may include a plurality of depressions DP_1, which are formed as closed curves, and a plurality of protrusions PP_1, which are formed as closed curves. However, the inventive concepts are not limited to this. Alternatively, each of the first pattern parts PT1_1 may include depressions DP_1, which are formed as closed curves, and flat surfaces, which are disposed between the depressions DP_1, and each of the second pattern parts PT2_1 may include depressions DP_1, which are formed as closed curves, and flat surfaces, which are disposed between the depressions DP_1.

The depressions DP_1 of each of the first pattern parts PT1_1 and the depressions DP_1 of each of the second pattern parts PT2_1 may be formed as quadrangular closed curves in a plan view, but the present disclosure is not limited thereto. Alternatively, the depressions DP_1 of each of the first pattern parts PT1_1 and the depressions DP_1 of each of the second pattern parts PT2_1 may be formed as polygonal closed curves such as triangular or pentagonal closed curves in a plan view.

The pattern of arrangement of the first pattern parts PT1_1 in pattern areas PA disposed in the first region DR1 may be different from the pattern of arrangement of the second pattern parts PT2_1 in pattern areas PA disposed in the second regions DR2. For example, the second pattern parts PT2_1 disposed in the pattern areas PA disposed in the second regions DR2, which are curved, may be more densely arranged than the first pattern parts PT1_1 disposed in the pattern areas PA disposed in the first region DR1, which is flat.

The numbers of protrusions PP_1 and depressions DP_1 of each of the first pattern parts PT1_1 may be greater than the numbers of protrusions PP_1 and depressions DP_1 of each of the second pattern parts PT2_1, but the inventive concepts are not limited thereto. In some exemplary embodiments, the numbers of protrusions PP_1 and depressions DP_1 of each of the first pattern parts PT1_1 may be the same as the numbers of protrusions PP_1 and depressions DP_1 of each of the second pattern parts PT2_1. In some embodiments, the numbers of protrusions PP_1 and depressions DP_1 of each of the first pattern parts PT1_1 may be smaller than the numbers of protrusions PP_1 and depressions DP_1 of each of the second pattern parts PT2_1.

In a plan view, the depressions DP_1 of each of the first pattern parts PT1_1 may have a different width from the depressions DP_1 of each of the second pattern parts PT2_1. For example, the depressions DP_1 of each of the first pattern parts PT1_1 may have a greater width than the depressions DP_1 of each of the second pattern parts PT2_1.

The exemplary embodiment of FIG. 22 differs from the exemplary embodiment of FIG. 21 in that each of first pattern parts PT1_2 includes depressions DP_2, which are formed as circular closed curves in a plan view, and a plurality of protrusions PP2, which are formed as circular closed curves in a plan view, and that each of second pattern parts PT2_2 also includes depressions DP_2, which are formed as circular closed curves in a plan view, and a plurality of protrusions PP2, which are formed as circular closed curves in a plan view, and thus, a detailed description of the exemplary embodiment of FIG. 22 will be omitted.

According to the aforementioned and other exemplary embodiments of the present invention, since a pattern layer having a high refractive index is placed above organic light-emitting diodes (OLEDs), reflected light that is visible to the eyes of the user can be reduced by diffusing external light, and as a result, the quality of an image can be improved. Also, the emission efficiency of a display device can be improved by guiding, via a light path changing layer, light traveling in a lateral direction to be emitted in an upward direction.

Although certain exemplary embodiments have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a display unit including a first region, which is flat, and second regions, which are curved; and
a touch sensor layer disposed on the display unit, wherein:
the touch sensor layer comprises a high refractive index layer having a first refractive index and a planarization layer disposed on the high refractive index layer and having a second refractive index, which is smaller than the first refractive index;
the high refractive index layer includes pattern parts;
the pattern parts comprise first pattern parts disposed in the first region and second pattern parts disposed in the second regions;
each of the first pattern parts comprises a plurality of protrusions and a plurality of depressions;
each of the second pattern parts comprises a plurality of protrusions and a plurality of depressions;
the depressions of each of the first pattern parts have a first pitch; and
the depressions of each of the second pattern parts have a second pitch, which is smaller than the first pitch.

2. The display device of claim 1, wherein:
each of the first region and the second regions includes light-emitting areas and non-light-emitting areas;
the first pattern parts overlap with the light-emitting areas of the first region in a thickness direction; and
the second pattern parts overlap with the light-emitting areas of each of the second regions in the thickness direction.

3. The display device of claim 2, wherein each of the light-emitting areas includes a first electrode, a light-emitting layer, and a second electrode.

4. The display device of claim 2, further comprising a buffer layer disposed between the touch sensor layer and the display unit,
wherein the buffer layer has a third refractive index greater than the first refractive index.

5. The display device of claim 4, wherein the high refractive index layer comprises a first high refractive index layer disposed on the buffer layer and a second high refractive index layer disposed on the first high refractive index layer.

6. The display device of claim 5, wherein:
the touch sensor layer includes driving electrodes and sensing electrodes; and
the driving electrodes and the sensing electrodes are disposed between the first and second high refractive index layers.

7. The display device of claim 6, wherein the driving electrodes and the sensing electrodes do not overlap with the pattern parts in the thickness direction.

8. The display device of claim 7, wherein:
the first high refractive index layer comprises first depressions and first protrusions;
the second high refractive index layer comprises second depressions and second protrusions; and
the first depressions overlap with the second depressions in the thickness direction.

9. The display device of claim 4, further comprising:
a light-shielding member disposed on the planarization layer;
a color filter layer disposed on the planarization layer and on the light-shielding member; and
an overcoat layer disposed on the color filter layer,
wherein the light-shielding member does not overlap with the pattern parts in the thickness direction.

10. The display device of claim 9, further comprising a light path changing layer disposed on the overcoat layer, wherein:
the light path changing layer comprises a first light path changing layer disposed on the overcoat layer and a second light path changing layer disposed on the first light path changing layer and on the overcoat layer; and
the first light path changing layer does not overlap with the pattern parts in the thickness direction.

11. The display device of claim 10, wherein:
the first light path changing layer has a fourth refractive index; and
the second light path changing layer has a fifth refractive index, which is greater than the fourth refractive index.

12. The display device of claim 11, wherein a maximum thickness of the second light path changing layer is greater than a maximum thickness of the first light path changing layer.

13. A display device comprising:
a display unit including light-emitting areas and non-light-emitting areas; and
a touch sensor layer disposed on the display unit, wherein:
the touch sensor layer comprises a high refractive index layer, which includes pattern parts that overlap with the light-emitting areas in a thickness direction, and touch electrodes, which overlap with the non-light-emitting areas in the thickness direction; and each of the pattern parts comprises a plurality of protrusions and a plurality of depressions.

14. The display device of claim 13, wherein the touch sensor layer further comprises a planarization layer disposed on the high refractive index layer and having a smaller refractive index than the high refractive index layer.

15. The display device of claim 14, further comprising a buffer layer disposed between the display unit and the high refractive index layer and having a greater refractive index than the high refractive index layer.

16. The display device of claim 15, wherein:
the display unit includes a first region, which is flat, and second regions, which are curved; and
the depressions have a first pitch in the first region and a second pitch, which is smaller than the first pitch, in the second regions.

* * * * *